(12) United States Patent
Wang et al.

(10) Patent No.: US 12,154,896 B2
(45) Date of Patent: Nov. 26, 2024

(54) THREE-DIMENSIONAL INTEGRATED CIRCUIT PACKAGES AND METHODS OF FORMING THE SAME

(71) Applicant: Taiwan Semiconductor Manufacturing Company, Ltd., Hsinchu (TW)

(72) Inventors: Chin-Hua Wang, New Taipei (TW); Yu-Sheng Lin, Hsinchu County (TW); Chia-Kuei Hsu, Hsinchu (TW); Shu-Shen Yeh, Taoyuan (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 5 days.

(21) Appl. No.: 17/460,353

(22) Filed: Aug. 30, 2021

(65) Prior Publication Data
US 2023/0063692 A1     Mar. 2, 2023

(51) Int. Cl.
| H01L 23/14 | (2006.01) |
| H01L 23/00 | (2006.01) |
| H01L 23/31 | (2006.01) |
| H01L 23/528 | (2006.01) |
| H01L 27/06 | (2006.01) |

(52) U.S. Cl.
CPC .......... *H01L 27/0688* (2013.01); *H01L 23/14* (2013.01); *H01L 23/31* (2013.01); *H01L 23/528* (2013.01); *H01L 24/14* (2013.01)

(58) Field of Classification Search
CPC ........ H01L 23/14; H01L 23/528; H01L 24/14
See application file for complete search history.

(56) References Cited

U.S. PATENT DOCUMENTS

| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |

(Continued)

FOREIGN PATENT DOCUMENTS

| TW | 202025412 | 7/2020 |
| TW | 202038353 | 10/2020 |

OTHER PUBLICATIONS

"Office Action of Taiwan Counterpart Application", issued on Nov. 21, 2022, p. 1-p. 8.

*Primary Examiner* — Trang Q Tran
(74) *Attorney, Agent, or Firm* — JCIPRNET

(57) ABSTRACT

In an embodiment, a three-dimensional integrated circuit (3DIC) package includes an interposer, a plurality of connection pads, a plurality of dummy patterns, a plurality of integrated circuit structures and an underfill layer. The connection pads are disposed on and electrically connected to a first side of the interposer. The dummy patterns are disposed on the first side of the interposer and around the plurality of connection pads. The integrated circuit structures are electrically connected to the connection pads through a plurality of first bumps. The underfill layer surrounds the first bumps and covers the dummy patterns.

20 Claims, 26 Drawing Sheets

(56) References Cited

U.S. PATENT DOCUMENTS

| | | |
|---|---|---|
| 9,496,189 B2 | 11/2016 | Yu et al. |
| 9,666,502 B2 | 5/2017 | Chen et al. |
| 9,735,131 B2 | 8/2017 | Su et al. |
| 2016/0064357 A1* | 3/2016 | Choe ........................ H01L 24/10 |
| | | 438/109 |
| 2016/0358865 A1* | 12/2016 | Shih ......................... H01L 24/97 |
| 2021/0384143 A1* | 12/2021 | Park ......................... H01L 23/14 |
| 2022/0013497 A1* | 1/2022 | Choi ................. H01L 23/49816 |

* cited by examiner

THREE-DIMENSIONAL INTEGRATED CIRCUIT PACKAGES AND METHODS OF FORMING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components matched smaller packages that occupy less area than previous packages. Examples of the types of semiconductor packages include quad flat packages (QFP), pin grid array (PGA) packages, ball grid array (BGA) packages, flip chips (FC), three-dimensional integrated circuit (3DIC) packages, wafer level packages (WLPs), package on package (PoP) devices, etc. The 3DIC packages provide improved integration density and other advantages, such as faster speeds and higher bandwidth, because of the decreased length of interconnects between the stacked chips. However, there are many challenges related to 3DIC packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
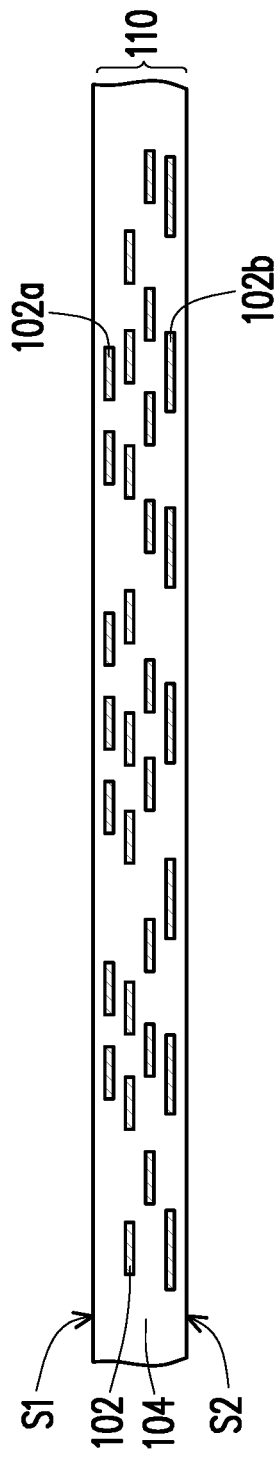
FIG. 1A to FIG. 1I are cross-sectional views of a method of forming a three-dimensional integrated circuit (3DIC) package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1I are cross-sectional views of a method of forming a 3DIC package in accordance with some embodiments. It is understood that the disclosure is not limited by the method described below. Additional operations can be provided before, during, and/or after the method and some of the operations described below can be replaced or eliminated, for additional embodiments of the methods.

Referring to FIG. 1A, an interposer substrate 110 is provided. In some embodiments, the interposer substrate 110 is provided as a wafer-type interposer substrate at this stage. The interposer substrate 110 is referred to as an "interposer wafer" in some examples. The interposer substrate 110 may include multiple device package regions that are singulated in the subsequent operation to form separate interposers.

In some embodiments, the interposer substrate 110 is configured to provide electrical connection between components. In some embodiments, the interposer substrate 110 is a silicon-free substrate including wring layers 102 embedded by polymer layers 104. The wring layers 102 include metal lines and/or metal vias. In some embodiments, each wring layer 102 includes Cu, Al, Ti, Ta, W, Ru, Co, Ni, the like, or a combination thereof. In some embodiments, a seed layer and/or a barrier layer may be disposed between each wiring layer 102 and the adjacent polymer layer 104. The seed layer may include Ti/Cu. The barrier layer may include Ta, TaN, Ti, TiN, CoW or a combination thereof. The wiring layers 102 are formed by multiple electroplating processes, damascene processes or dual-damascene processes. In some embodiments, each polymer layer 104 includes an organic material, such as epoxy impregnated glass-fiber laminate, polymer impregnated glass-fiber laminate, preimpregnated composite fiber, Ajinomoto build-up film (ABF), molding compound, epoxy, polybenzoxazole (PBO), polyimide (PI), benzocyclobutene (BCB), the like, or a combination thereof. The interposer substrate 110 may be referred to an "organic interposer" in some examples. The polymer layers 104 of the interposer substrate 110 may be replaced by dielectric layers or insulating layers as needed.

In some embodiments, the interposer substrate 110 has a first side S1 and a second side S2 opposite to the first side S1. In some embodiments, the wring layers 102 includes first metal features 102a adjoined to the first side S1 and second metal features 102b adjoined to the second side S2.

In some embodiments, the interposer substrate 110 is a passive interposer, which is used to convey a lack of a functional device or integrated circuit device. Such passive interposer is referred to as a "device-free interposer" in some examples.

In other embodiments, the interposer substrate 110 is an active interposer that contains at least one functional device or integrated circuit device embedded in the polymer layers 104 and electrically connected to the wiring layers 102. Such active interposer is referred to as a "device-containing interposer" in some examples. In some embodiments, the functional device includes an integrated active device, an integrated passive device, or a combination thereof. The integrated active device may include a logic device, a memory device, a MOSFET device, a CMOS device, a BJT device, a system on chip (SoC), the like, or a combination thereof. The integrated passive device may include a resistor, a capacitor, an inductor, a resonator, a filter, the like, or a combination thereof.

Figure 1B:
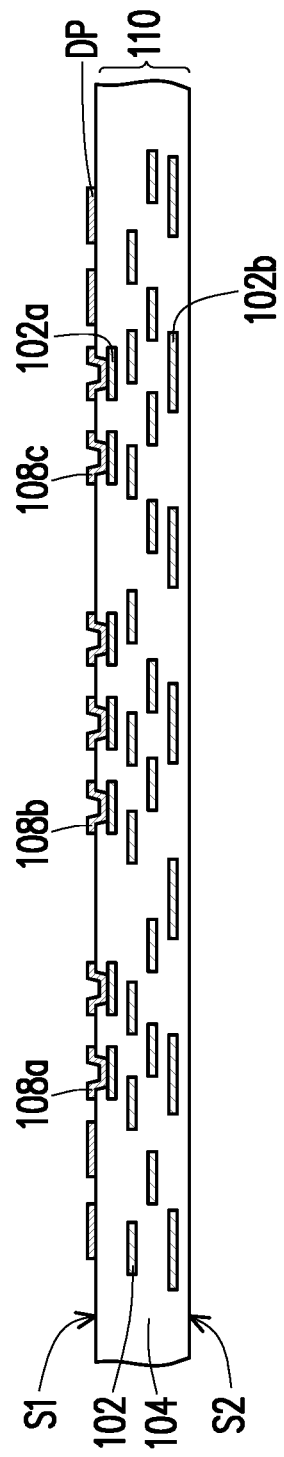

Referring to FIG. 1B, a plurality of connection pads 108a, 108b and 108c (collectively referred to as connections pads 108) and a plurality of dummy patterns DP are formed over the first side S1 of the interposer substrate 110. The connection pads 108 are referred to under bump metallization (UBM) pads in some examples. In some embodiments, the connection pads connection pads 108a, 108b and 108c are configured to electrically connect to different overlying integrated circuit structures, respectively.

The connection pads 108 are electrically connected to the underlying wiring layers 102 of the interposer substrate 110, while the dummy patterns DP are at a floating potential and are electrically insulated from the underlying wiring layers 102 of the interposer substrate 110. In some embodiments, the dummy patterns DP are aside the connection pads 108. For example, the dummy patterns DP surround the connection pads 108. However, the disclosure is not limited thereto. In other embodiments, the dummy patterns DP are disposed at one side of the connection pads 108. For example, the dummy patterns DP are disposed at a location corresponding to the underfill dispenser location. The dummy patterns DP are configured to prevent an underfill material from creeping onto the exposed surfaces of the chips during the subsequent underfill dispensing step, which will be described in details below. In some embodiments, the connections pads 108 and the dummy patterns DP are regarded as part of the interposer substrate 110.

In some embodiments, the connection pads 108 and the dummy patterns DP are made by the same material, such as metal. For example, the connection pads 108 and the dummy patterns DP include copper, nickel, titanium, the like, or a combination thereof, and are formed by an electroplating process. In some embodiments, the connection pads 108 and the dummy patterns DP are formed by the same photolithography reticle or photomask. That is, an additional photolithography reticle for forming the dummy patterns DP is not required. In some embodiments, the connection pads 108 and the dummy patterns DP have a similar shape in a top view, but have different shapes in a cross-sectional view. For example, the connection pads 108 and the dummy patterns DP are circular in a top view, while the connection pads 108 have a recess shape and the dummy patterns DP have a horizontal I-shape in a cross-sectional view, as shown in FIG. 1B. In other embodiments, the connection pads 108 and the dummy patterns DP have a similar shape either in a top view or in a cross-sectional view. In yet other embodiments, the connection pads 108 and the dummy patterns DP have different shapes either in a top view or in a cross-sectional view.

In some embodiments, the connection pads 108 and the dummy patterns DP have substantially the same dimension, size and/or top-view area. For example, the connection pads 108 and the dummy patterns DP are made by the same material, provided with substantially equal thickness, and formed simultaneously in the same process step. In other embodiments, the connection pads 108 and the dummy patterns DP have different dimensions, sizes or top-view areas. For example, the connection pads 108 and the dummy patterns DP are made by the same material or different materials, provided with different thicknesses, and formed in different process steps.

Figure 1C:
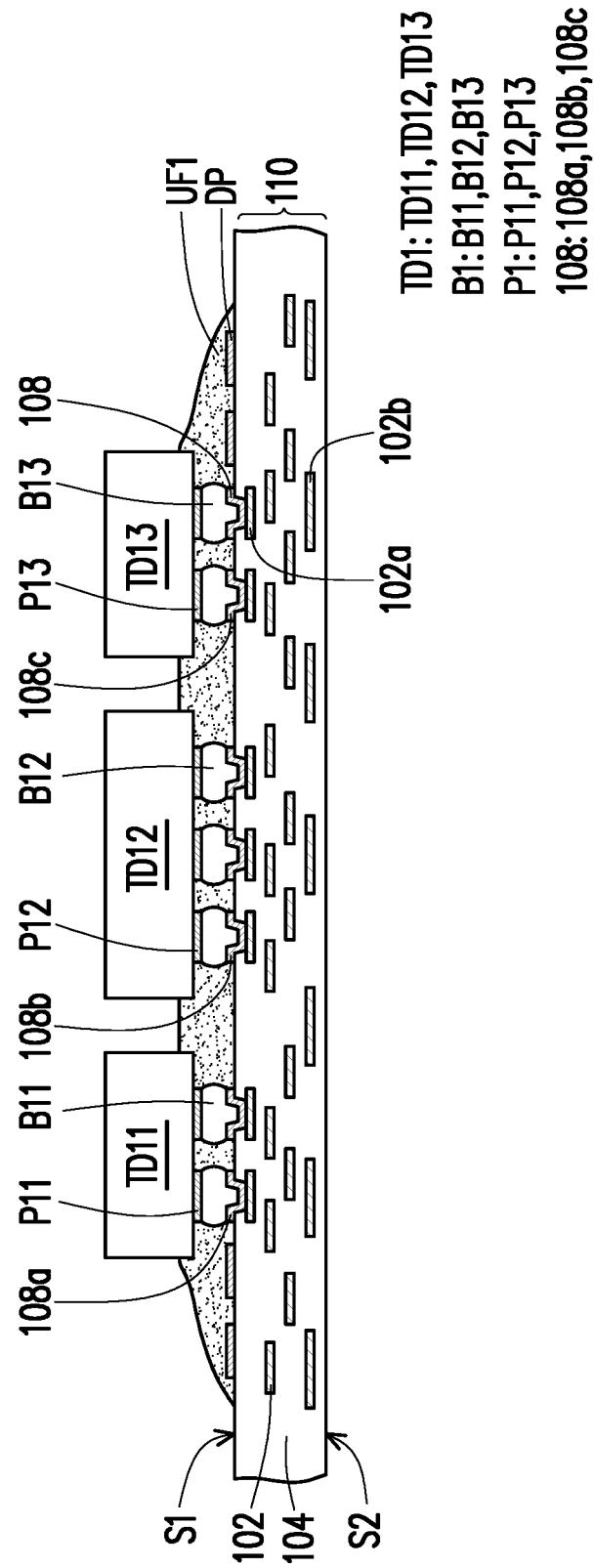

Referring to FIG. 1C, a plurality of integrated circuit structures TD11, TD12 and TD13 are arranged side by side, disposed over and bonded to the first side S1 of the interposer substrate 110. In some embodiments, the integrated circuit structures TD11 and TD13 are periphery integrated circuit structures around the central integrated circuit structures TD12. In some embodiments, the integrated circuit structures TD11, TD12 and TD13 (collectively referred to as integrated circuit structures TD1) are electrically connected to the connection pads 108a, 108b and 108c (collectively referred to as connection pads 108) of the interposer substrate 110 through bumps B11, bumps B12 and B13 (collectively referred to as bumps B1), respectively.

Each of the integrated circuit structures TD11, TD12 and TD13 may be a single die or a die stack including multiple dies. The adjacent dies in the die stack may be vertically stacked through a solder joint or a hybrid bonding including a metal-to-metal bonding and a dielectric-to-dielectric bonding. In some embodiments, each of the integrated circuit structures TD11, TD12 and TD13 includes an integrated active device, an integrated passive device, or a combination thereof. The integrated active device may include a logic device, a memory device, a MOSFET device, a CMOS device, a BJT device, a system on chip (SoC), the like, or a combination thereof. The integrated passive device may include a resistor, a capacitor, an inductor, a resonator, a filter, the like, or a combination thereof. In some embodiments, each of the integrated circuit structures TD11, TD12 and TD13 may be a package, such as a chip-scale package (CSP), a multi-chip module (MCM) package or the like. In some embodiments, at least one of the integrated circuit structures TD11, TD12 and TD13 may be a dummy chip. Herein, a dummy die indicates a non-operating die, a die configured for non-use, a die without devices therein or a die configured to electrically couple together two other components, strengthen the package structure, and/or improve the heat dissipation.

In some embodiments, the integrated circuit structures TD11, TD12 and TD13 may have the same or different sizes and/or functions upon the design requirements. The resulting package is referred to as a "homogeneous package" when the integrated circuit structures TD11, TD12 and TD13 have the same function. The resulting package is referred to as a "heterogeneous package" when the integrated circuit structures TD11, TD12 and TD13 have different functions.

In some embodiments, the integrated circuit structures TD11, TD12 and TD13 (collectively referred to as integrated circuit structures TD1) include connection pads P11, P12 and P13 (collectively referred to as connection pads P1) respectively formed on tops thereof. In some embodiments, the sides of the integrated circuit structures TD11, TD12 and TD13 with the connection pads P11, P12 and P13 are referred to as front sides. In some embodiments, the connection pads P11, P12 and P13 include Cu, Al, Ti, Ta, W, Ru, Co, Ni, the like, or a combination thereof, and are formed by an electroplating process or a damascene process.

In some embodiments, the integrated circuit structures TD1 are flip-chipped on the interposer substrate 110. Specifically, the integrated circuit structures TD11, TD12 and TD13 are bonded to the connection pads 108a, 108b and 108c through the bumps B11, B12 and B13, respectively. The connectors or bumps B1 may be provided on the bonding sides of the integrated circuit structures TD1, on the bonding side of the interposer substrate 110, or on the bonding sides of both the integrated circuit structures TD1 and the interposer substrate 110. In some embodiments, the bumps B11, B12 and B13 include solder bumps, and/or may include metal pillars, solder caps formed on metal pillars, and/or the like. The metal pillars include copper, aluminum, gold, nickel, silver, palladium, tin, the like, or a combination thereof. The bumps B11, B12 and B13 are referred to as "micro bumps" in some examples. The bumps B11, B12 and B13 may be formed by a suitable process such as evaporation, electroplating, ball drop, or screen printing. The bumps B11/B12/B13 form joints between the connecting pads 108a/108b/108c on the interposer substrate 110 and the integrated circuit structures TD11/TD12/TD13, and electrically connect the interposer substrate 110 to the integrated circuit structures TD11/TD12/TD13.

FIG. 2 to FIG. 12 are simplified top views of 3DIC packages in accordance with some embodiments, in which few elements such as integrated circuit structures, dummy patterns and interposer are shown for simplicity and clarity of illustration. In some embodiments, FIG. 1C is the cross-sectional view taken along the line I-I' of each of FIG. 2 to FIG. 4.

Figure 2:
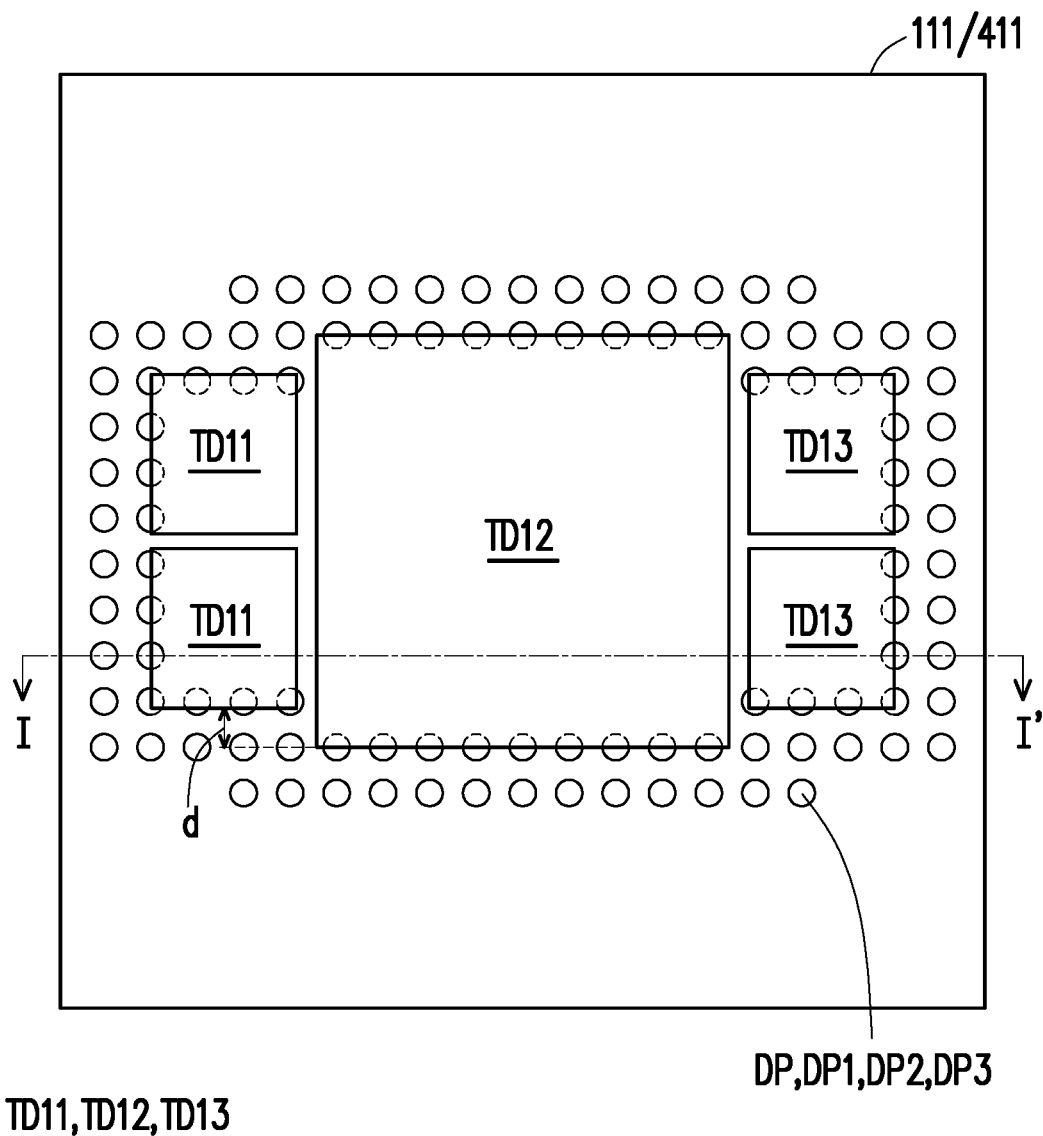
FIG. 2 to FIG. 12 are simplified top views of 3DIC packages in accordance with some embodiments.
Figure 3:
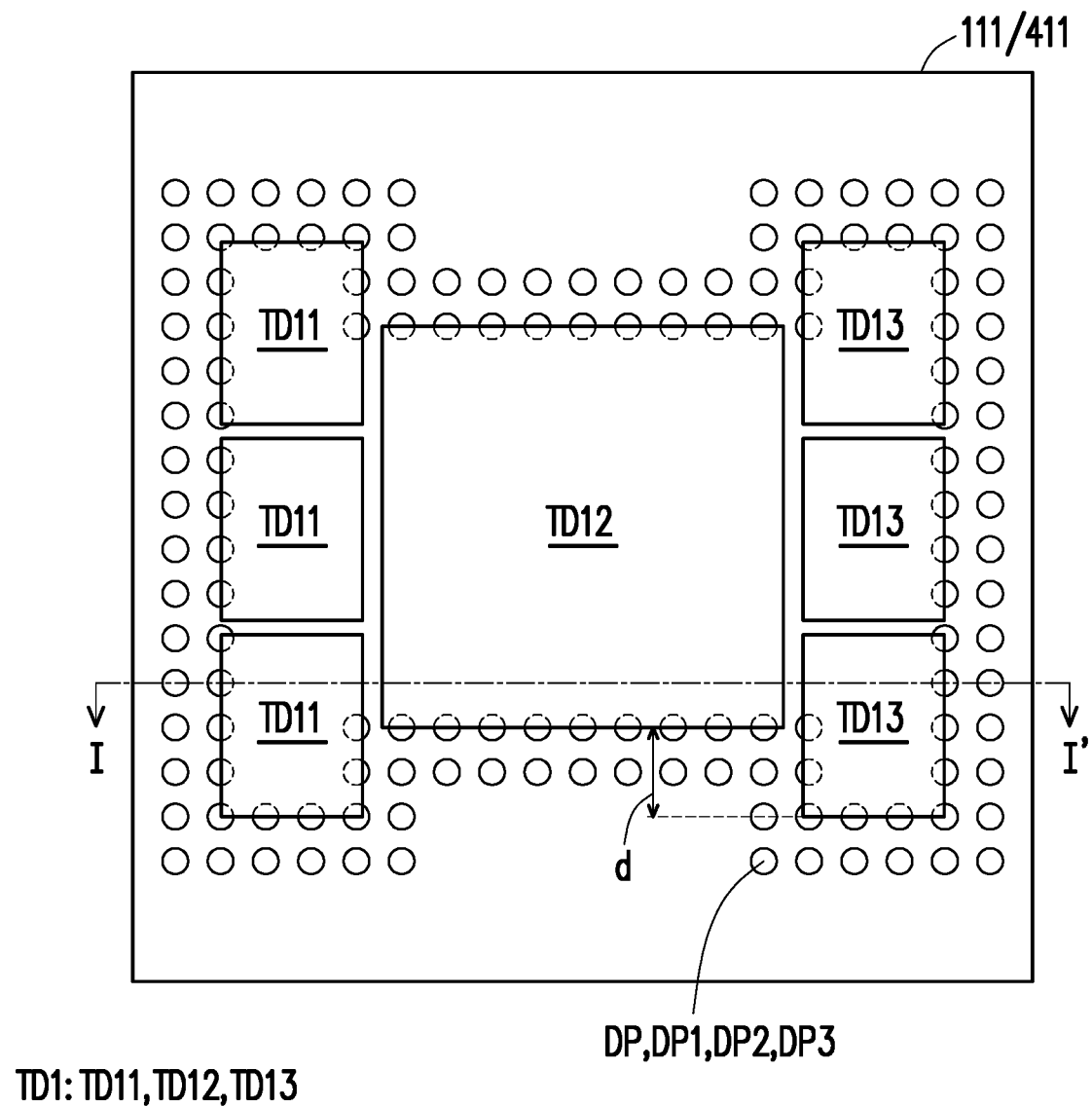
Figure 4:
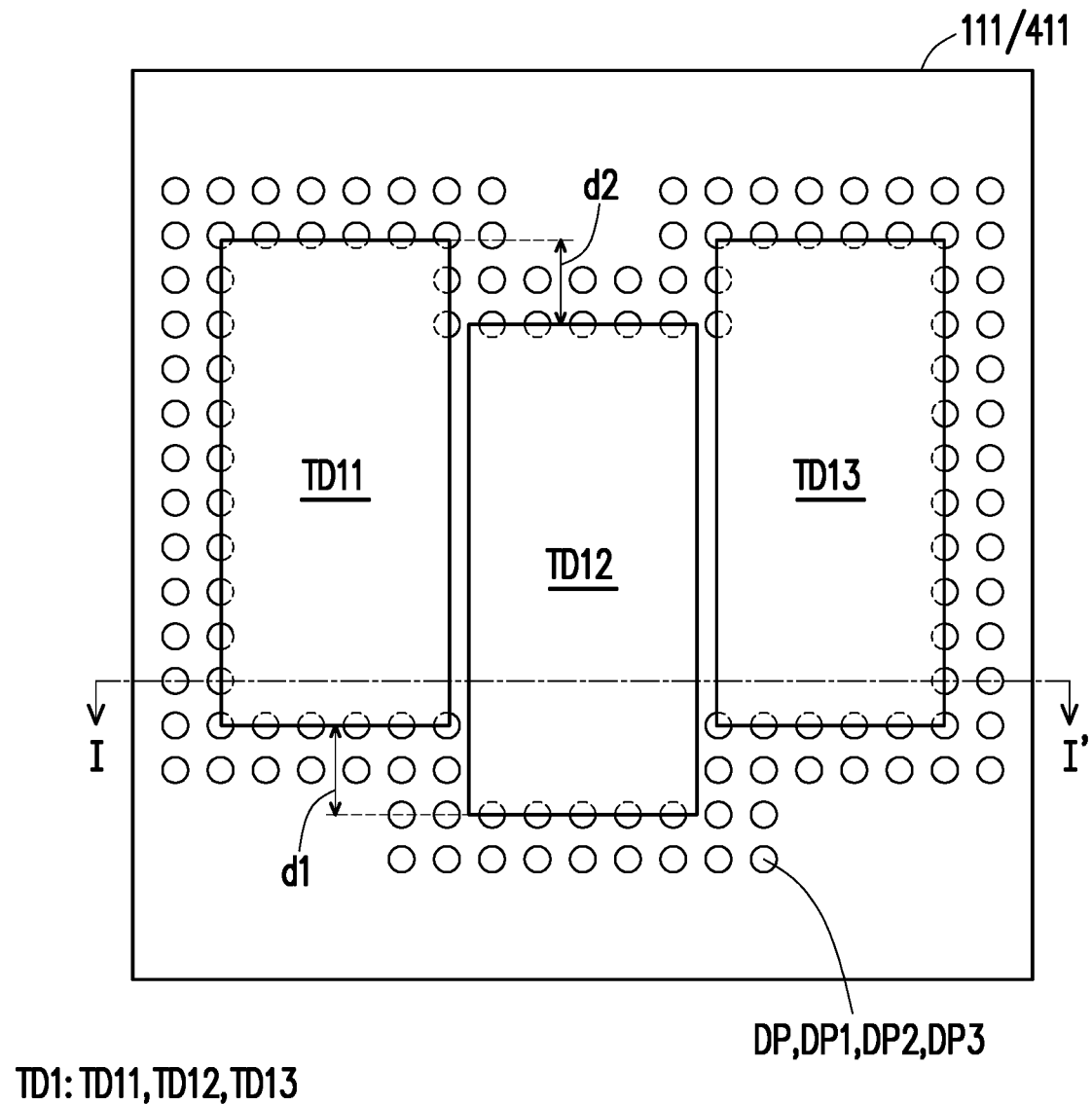
Figure 5:
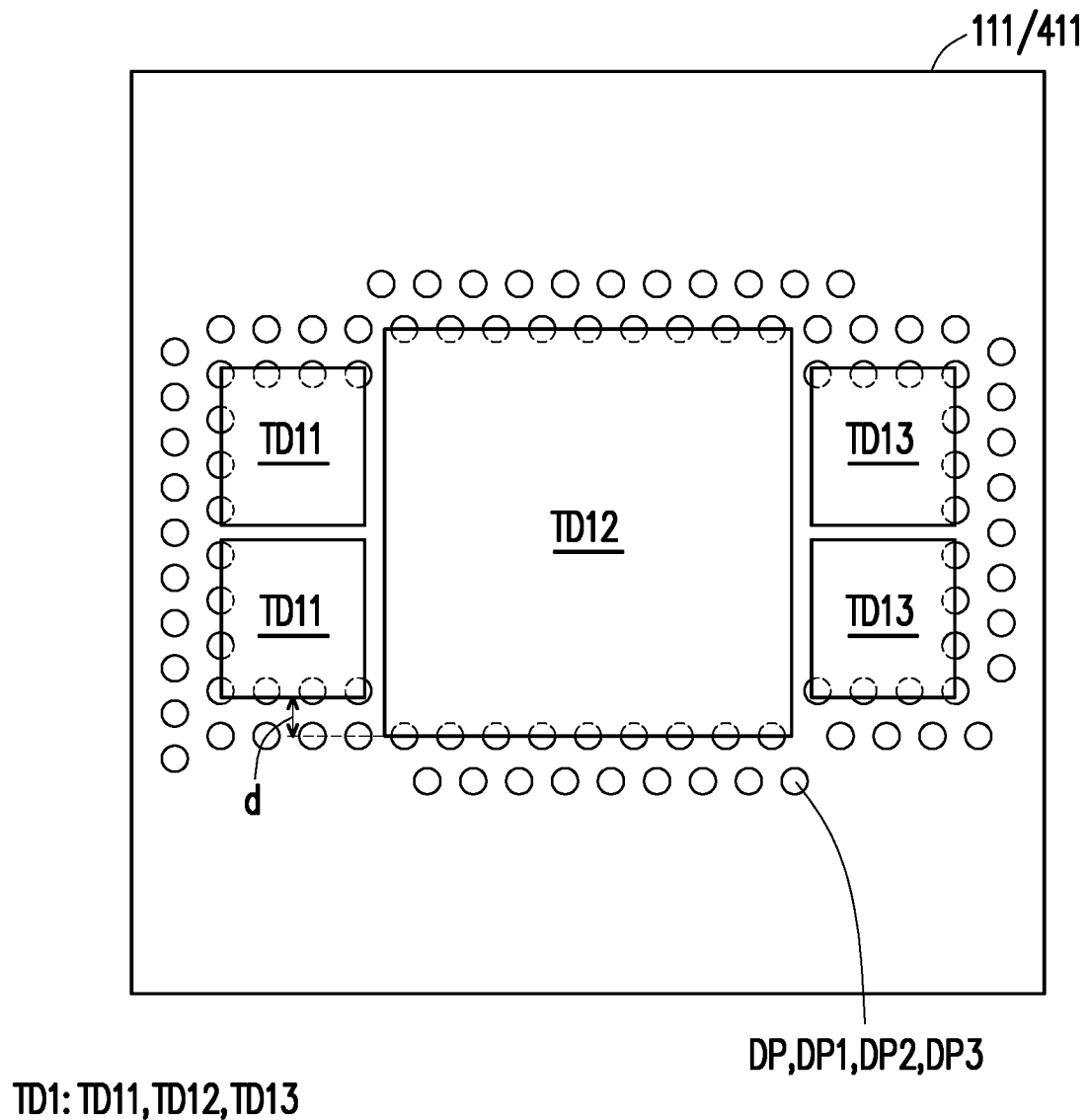
Figure 6:
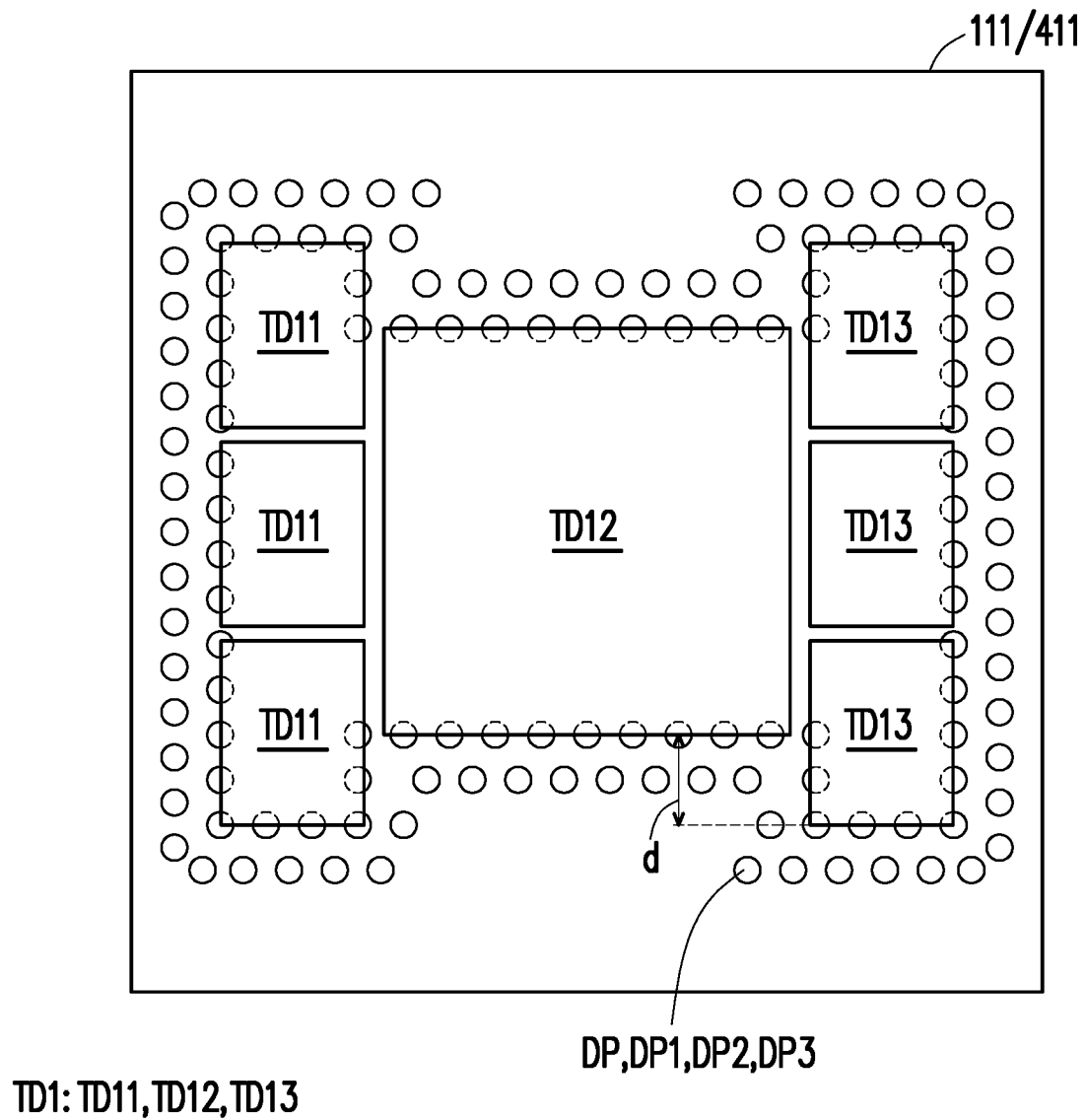
Figure 7:
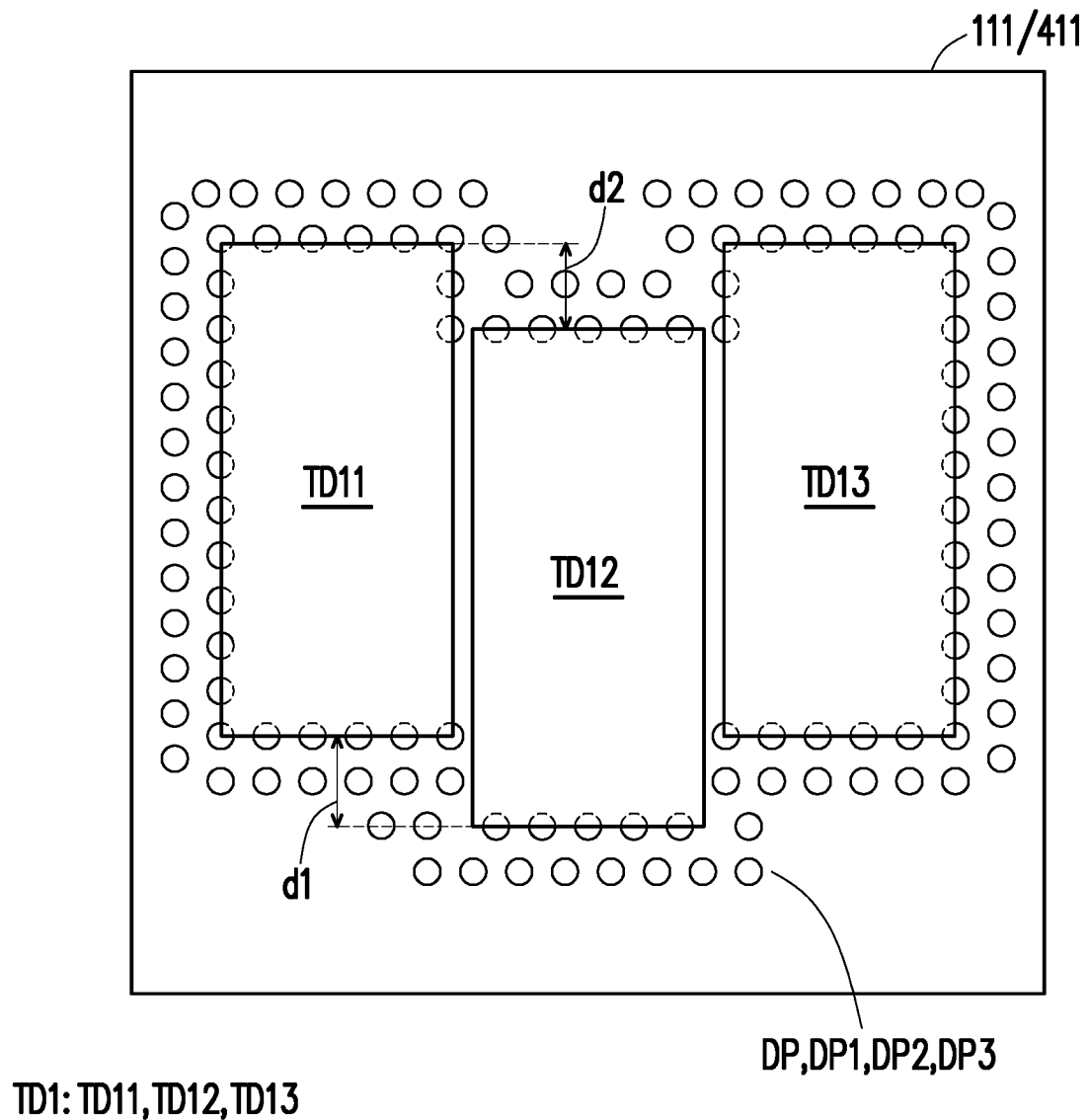
Figure 8:
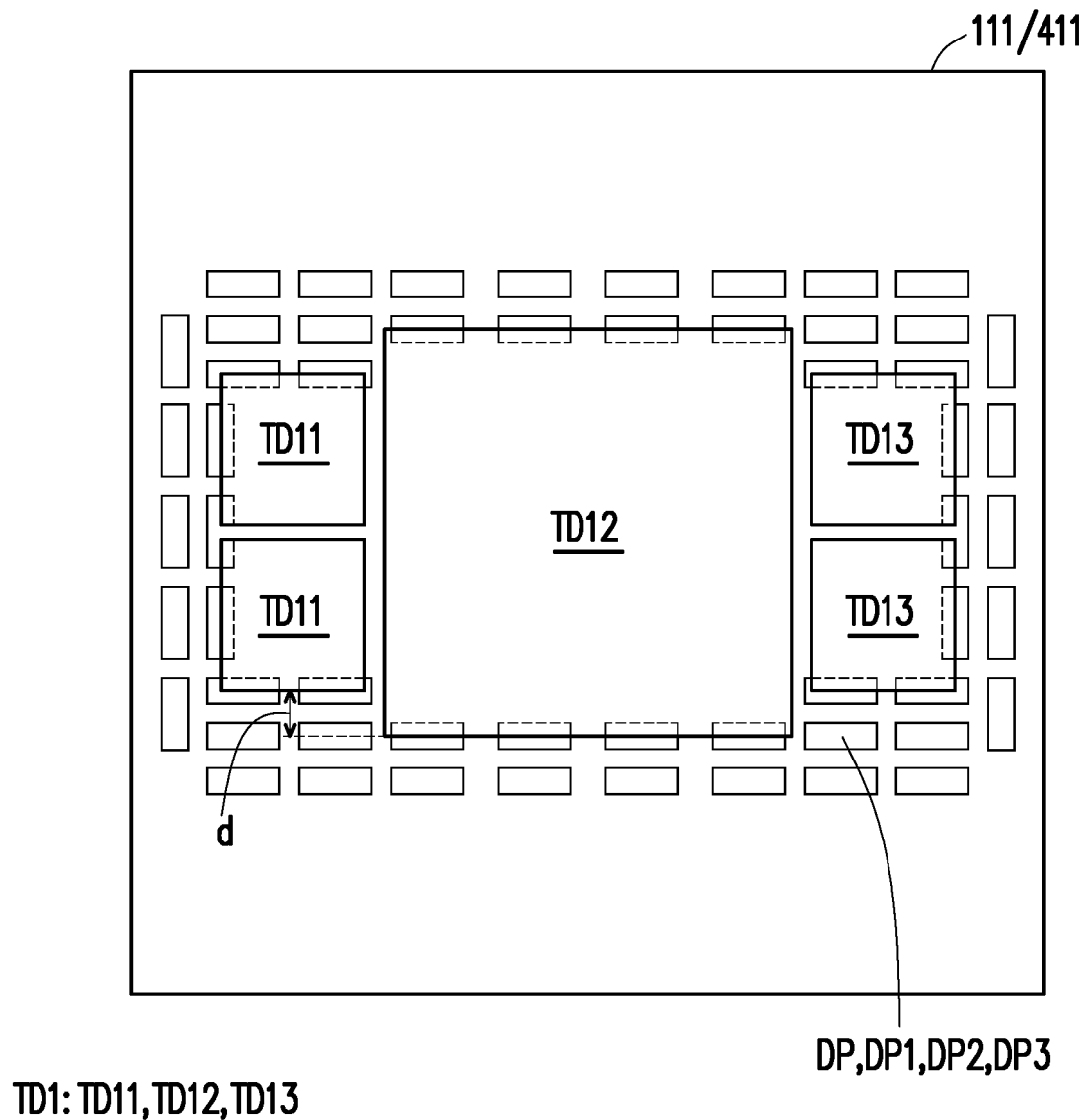
Figure 9:
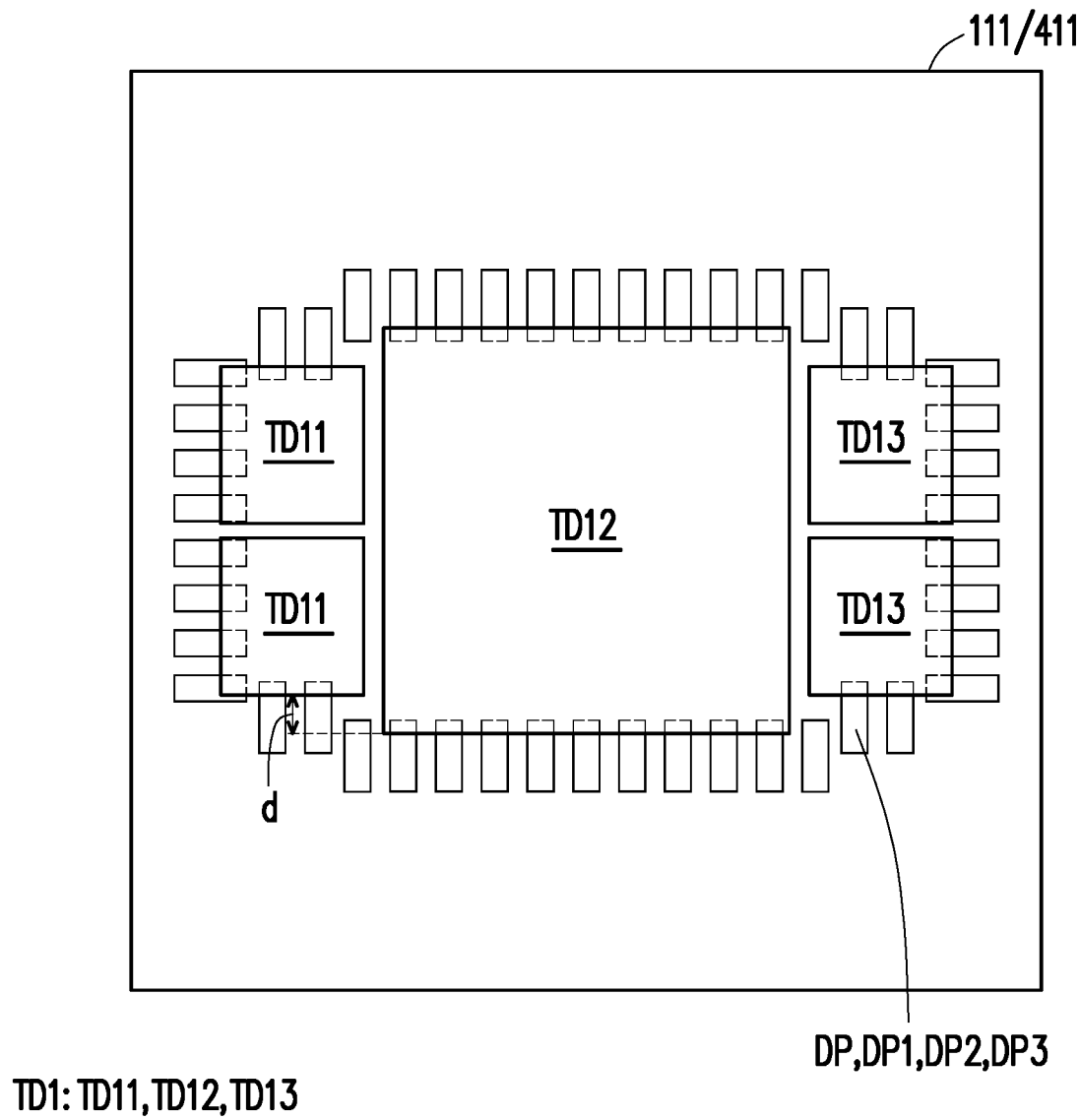
Figure 10:
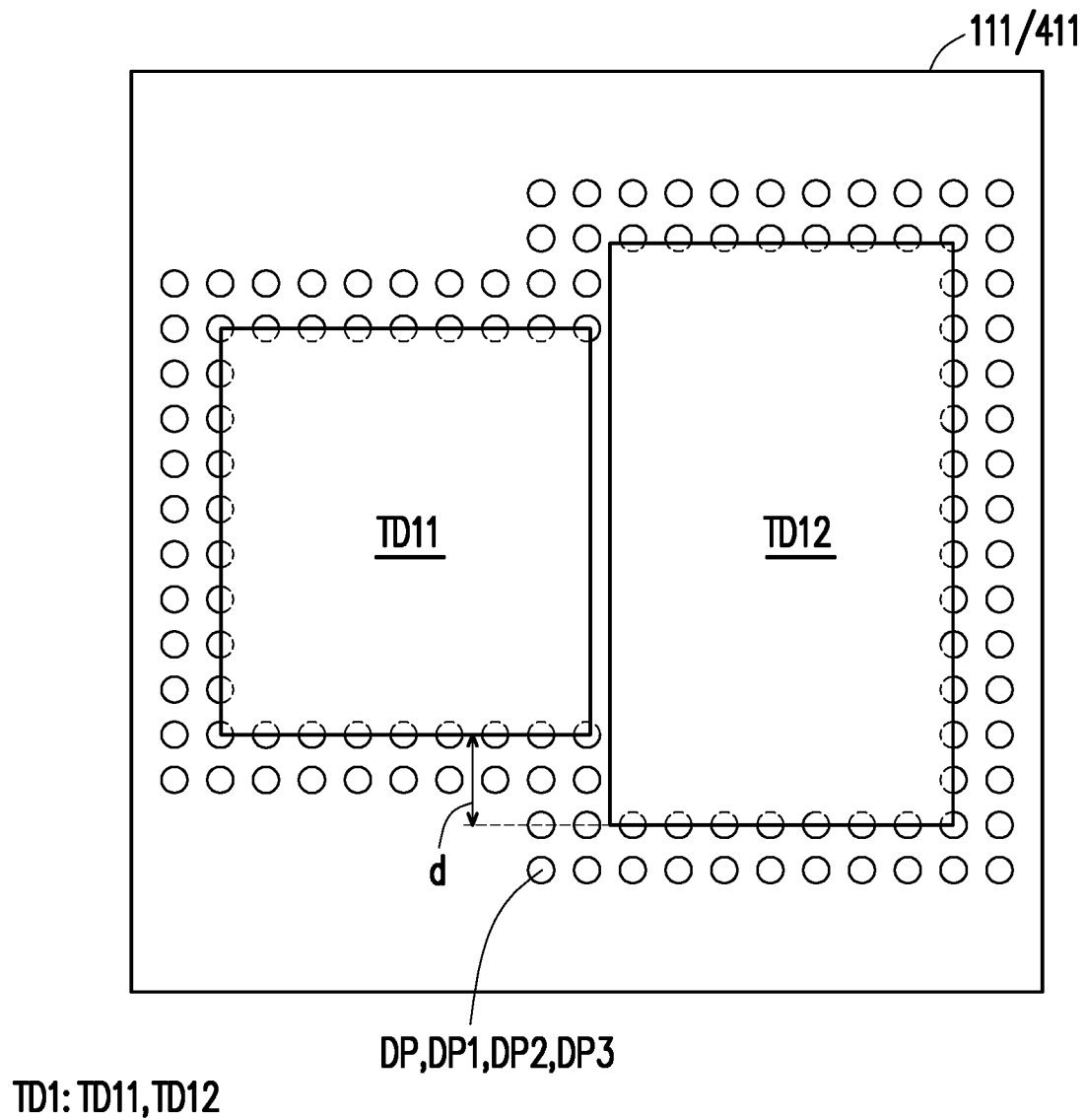
Figure 11:
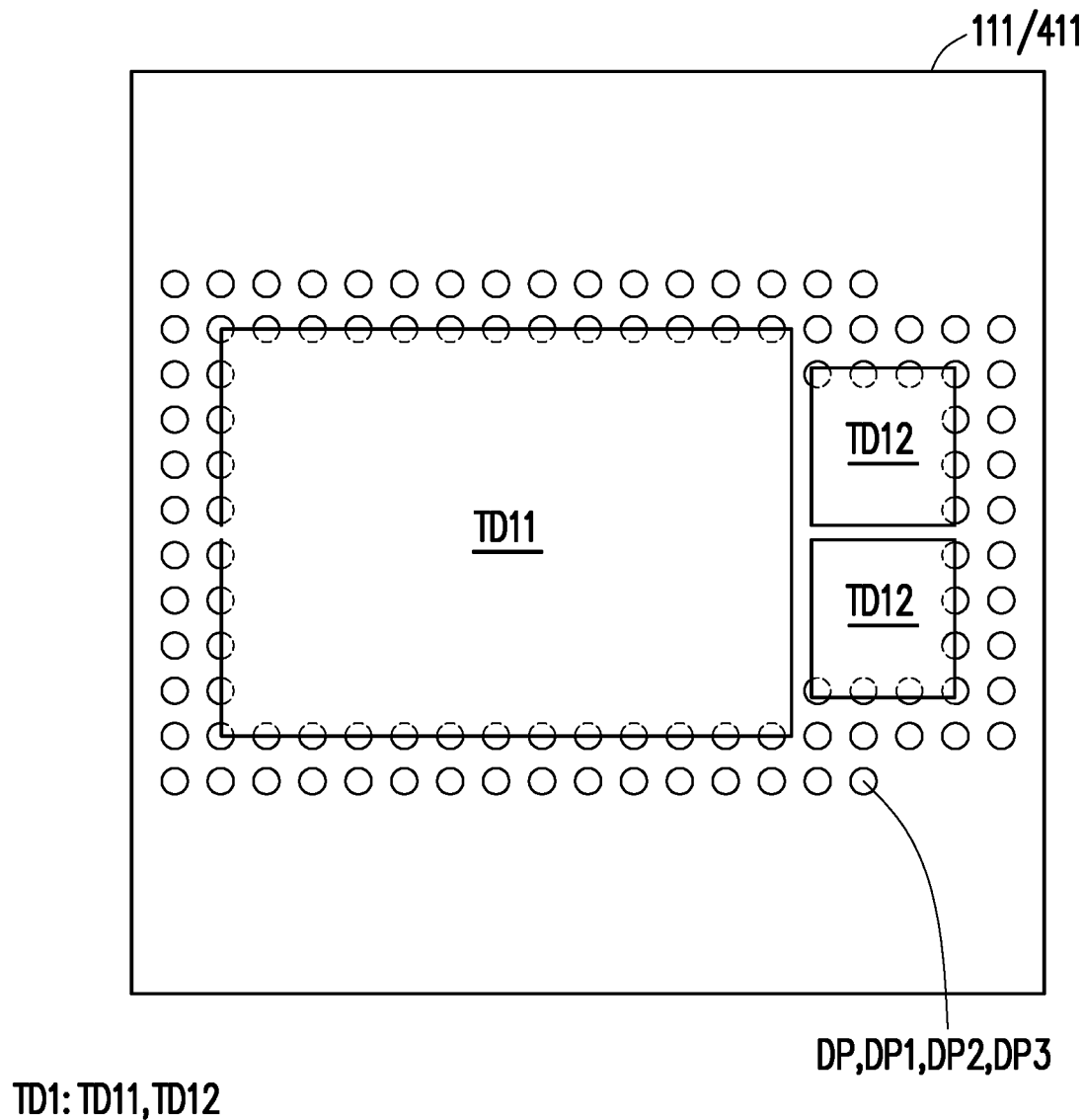
Figure 12:
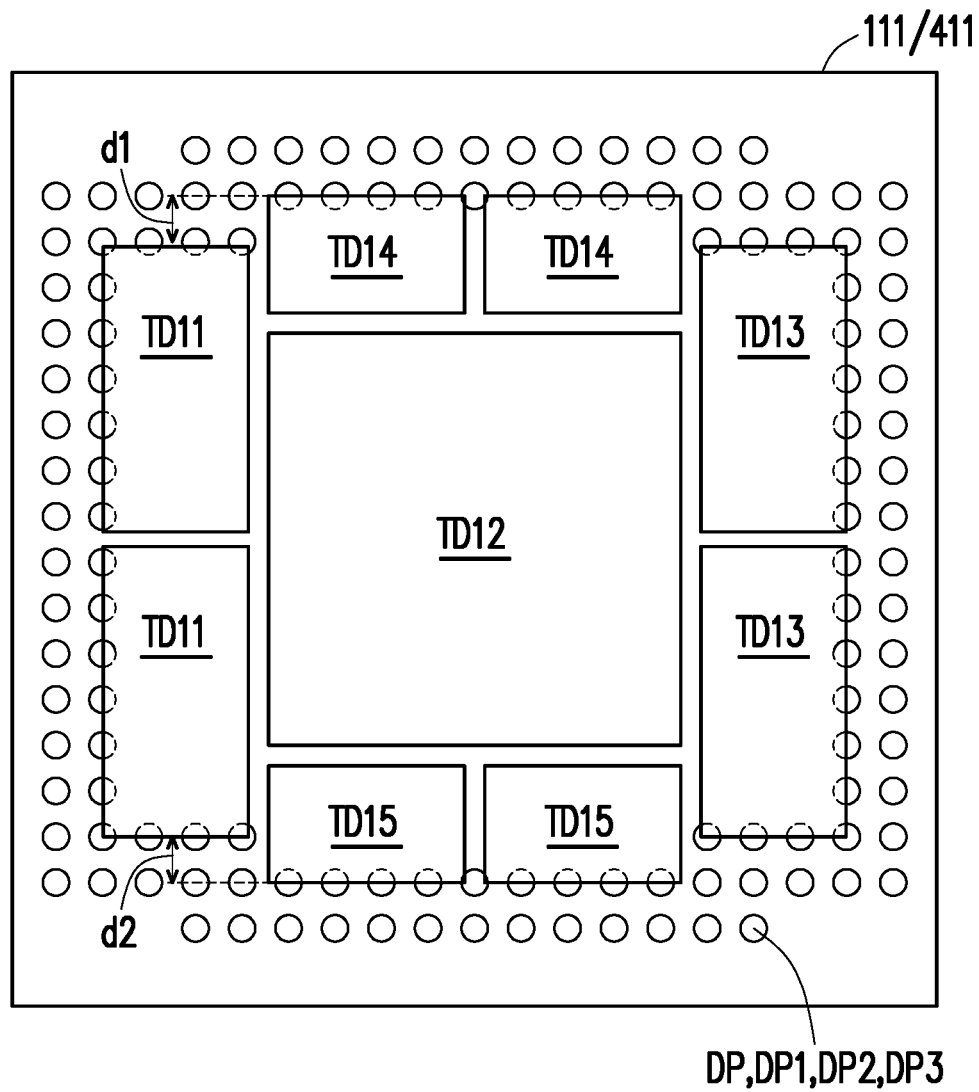

In some embodiments, an integrated circuit structure is protruded out from an adjacent integrated circuit structure of the integrated circuit structures, as shown in top views of FIG. 2 to FIG. 12. Specifically, from a top view, an outer edge of an integrated circuit structure is parallel to but not aligned with an outer edge of an adjacent integrated circuit structure of the plurality of integrated circuit structures. More specifically, the sidewall of an integrated circuit structure is offset from (e.g., not aligned with) the sidewall of an adjacent integrated circuit structure at the same side (e.g., bottom side or top view in the figures). As shown in FIG. 2, FIG. 5 and FIGS. 8-9, the integrated circuit structure TD12 is protruded out from the adjacent integrated circuit structure TD11 or TD13 by a non-zero distance "d". As shown in FIG. 3 and FIG. 6, the integrated circuit structure TD11 or TD13 is protruded out from the adjacent integrated circuit structure TD12 by a non-zero distance "d". As shown in FIG. 4 and FIG. 7, the integrated circuit structure TD12 is protruded out from the adjacent integrated circuit structure TD11 or TD13 by a non-zero distance "d1" at one side (e.g., bottom side in the figures), while the integrated circuit structure TD12 is recessed from the adjacent integrated circuit structure TD11 or TD13 by a non-zero distance "d2" at the opposite side (e.g., top side in the figures). As shown in FIG. 10, the integrated circuit structure TD12 is protruded out from the adjacent integrated circuit structure TD11 by a non-zero distance "d". As shown in FIG. 11, the integrated circuit structure TD11 is protruded out from the adjacent integrated circuit structure TD12 by a non-zero distance "d". As shown in FIG. 12, the integrated circuit structure TD14 is protruded out from the adjacent integrated circuit structure TD11 or TD13 by a non-zero distance "d1" at one side (e.g., top side in the figure), and the integrated circuit structure TD15 is protruded out from the adjacent integrated circuit structure TD11 or TD13 by a non-zero distance "d2" at the opposite side (e.g., bottom side in the figure).

The dummy patterns DP enclose the integrated circuit structures TD1 from a top view, as shown in FIGS. 2-12. In some embodiments, the dummy patterns DP are overlapped with at least one of the integrated circuit structures TD1 from a top view. For example, portions of the dummy patterns DP extend below the outermost integrated circuit structures TD1 by a non-zero distance. Specifically, the sides or sidewalls of the integrated circuit structures not adjacent to other integrated circuit structures are overlapped with at least one of dummy patterns DP.

In the above embodiments of FIGS. 2-4, the dummy patterns DP are arranged in an inline array (or non-staggered array) in which the dummy patterns DP in adjacent rows or columns are aligned to each other. However, the disclosure is not limited thereto. In FIGS. 5-7, the dummy patterns DP are arranged in a staggered array in which the dummy patterns DP in adjacent rows or columns are staggered to each other.

In some embodiments, the dummy patterns DP have substantially the same size, as shown in FIGS. 2-7. In other embodiments, the dummy patterns DP may have different sizes upon the process requirements. The sizes of the dummy patterns DP may be gradually reduced (or increased) away from the edge of the outermost integrated circuit structure TD13. In some embodiments, the dimension of one dummy pattern DP is different from the dimension of another dummy pattern DP adjacent to the one dummy pattern DP, and the dimension includes a height, a width, a length, a size, a top-view area or a combination thereof. The sizes and variations of the dummy patterns are not limited by the disclosure.

In some embodiments, the dummy patterns DP are arranged regularly or in a regular array. For example, the distance between two adjacent dummy patterns is constant, or the pitch of the dummy patterns is constant. In other embodiments, the dummy patterns DP are arranged irregularly or randomly. For example, the distance between two adjacent dummy patterns is not constant. The number of rows or columns and the distribution of the dummy patterns are not limited to the disclosure.

The above embodiments of FIG. 2-7 in which the dummy patterns DP are in a form of circular dots are provided for illustration purposes, and are not construed as limiting the present disclosure. The dots may be oval, square, rectangular, polygonal or have a combination shape. In other embodiments, the dummy patterns DP are in a form of strips or bars, as shown in FIGS. 8-9. The strips or bars may be straight, curved, wavy, serpentine or have a combination shape. The strips or bars can be parallel or non-parallel to each other. As shown in FIG. 8, the extension direction of the dummy patterns DP is parallel to (or aligned with) the corresponding side of the integrated circuit structure. As shown in FIG. 9, the extension direction of the dummy patterns DP is perpendicular to the corresponding side of the integrated circuit structure. In some embodiments, upon the process requirements, some dummy patterns DP are parallel to the sides of the integrated circuit structures, while some dummy patterns DP are non-parallel to (e.g., perpendicular to) the sides of the integrated circuit structures.

In some embodiments, the dummy patterns DP are separated from each other. In other embodiments, at least some of the dummy patterns DP are connected to each other. The shapes and configurations of the dummy patterns are not limited to the disclosure. Other shape such as a mesh structure with grids may be applicable, as long as the dummy patterns formed in such shape is able to prevent the underfill material from creeping onto the exposed surfaces (e.g., backsides) of the chips.

Dummy patterns are contemplated as falling within the spirit and scope of the present disclosure as long as the dummy patterns prevent an underfill material from creeping onto the undesired surface during the underfill dispensing step and are finally covered by the underfill material.

The number and configuration of the integrated circuit structures TD1 are not limited to the above embodiments either. Different number and configuration of the integrated circuit structures TD1 may be applicable to the disclosure, as shown in FIGS. 10-12. The arrangements and shapes of dummy patterns in FIGS. 2-9 may be applied to the dummy patterns in FIGS. 10-12.

Still referring to FIG. 1C, an underfill material is dispensed from an underfill dispenser onto the first side S1 of the interposer substrate 110. In some embodiments, the dispenser is located over and corresponds to the dummy patterns DP. The underfill material is then drawn by capillary action and therefore forms an underfill layer UF1 covering the dummy patterns DP and surrounding the bumps B11, B12 and B13. Specifically, the underfill layer UF1 may completely cover the tops and sidewalls of the dummy patterns DP, fill the gaps between the dummy patterns DP, fill the space between the interposer substrate 110 and each of the integrated circuit structures TD11, TD12 and TD13 and fill the space between two adjacent integrated circuit structures. The dummy patterns DP constrain the flow of the underfill material, so that the underfill material does not flow along the sidewall or even creep onto the backsides of the integrated circuit structures TD11, TD12 and TD13 during the underfill dispensing step. From another point of view, the dummy patterns DP function as "armor blocks" that trap the underfill material therein and therefore prevent the underfill material wave from bleeding to undesired components. In some embodiments, the dummy patterns DP can be referred to as "underfill dragging structures" or "underfill dissipating blocks" in some examples.

Figure 1D:
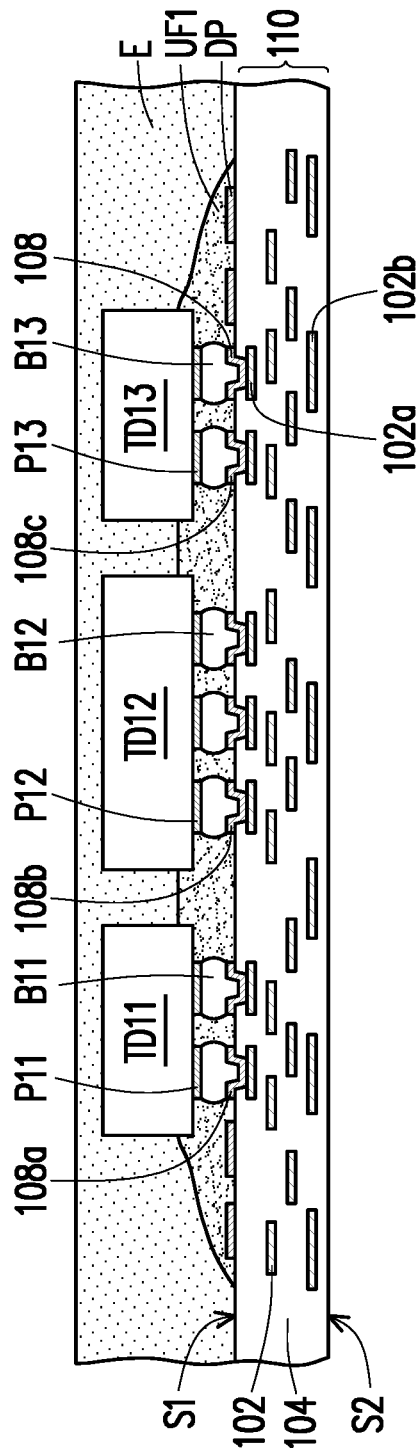

Referring to FIG. 1D, an encapsulation layer E is formed to encapsulate the underlying components. In some embodiments, the encapsulation layer E includes a molding compound, epoxy, or the like, and may be applied by compression molding, transfer molding, or the like. The encapsulation layer E may be formed over the interposer substrate 110 such that the integrated circuit structures TD11, TD12 and TD13 are buried or covered. The encapsulation layer E is then cured.

Figure 1E:
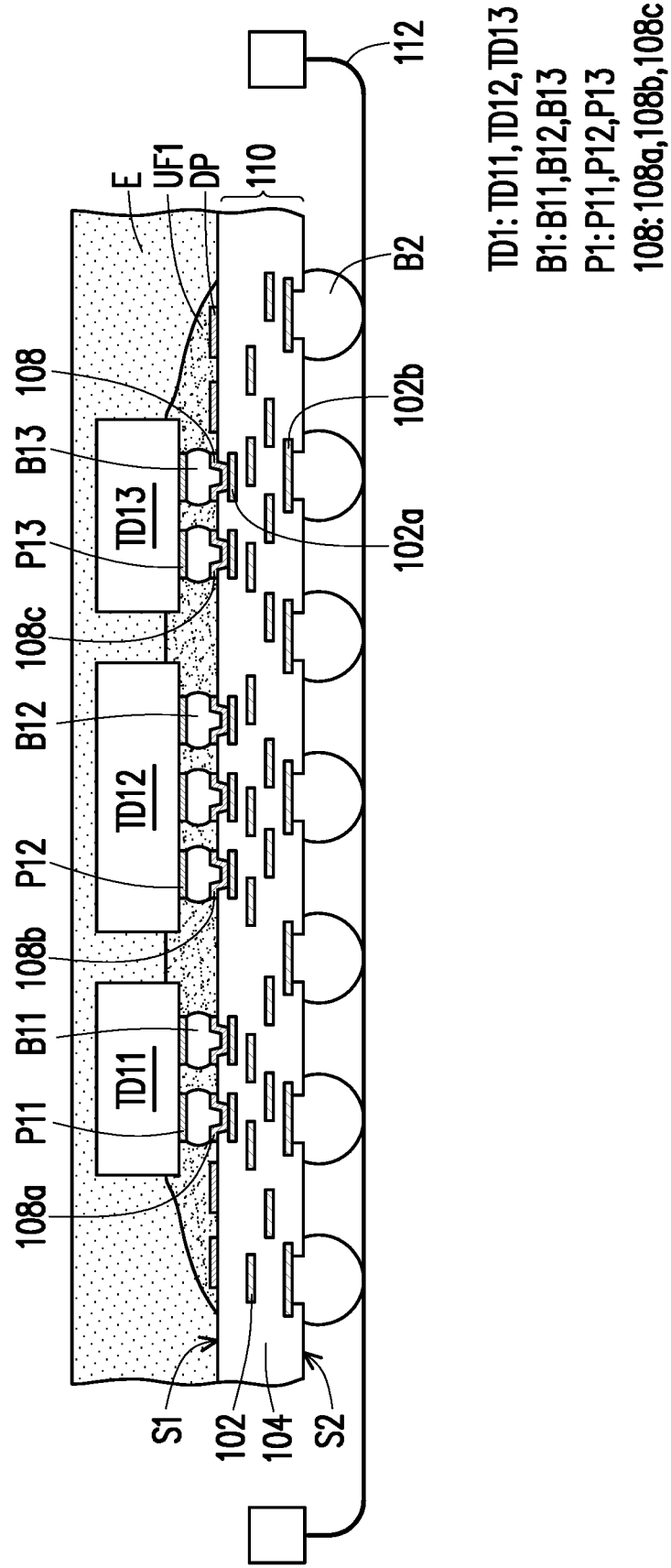

Referring to FIG. 1E, connectors or bumps B2 are formed on the second side S2 of the interposer substrate 110. The bumps B2 are electrically connected to second metal features 102b of the interposer substrate 110. In some embodiments, the bumps B2 include solder bumps, and/or may include metal pillars, solder caps formed on metal pillars, and/or the like. The metal pillars include copper, aluminum, gold, nickel, silver, palladium, tin, the like, or a combination thereof. The bumps B2 are referred to as "controlled collapse chip connection (C4) bumps" in some examples. The bumps B2 may be formed by a suitable process such as evaporation, electroplating, ball drop, or screen printing. After the bumps B2 are formed, the interposer substrate 110 may be placed on a tape 112 for subsequent processing operations.

Figure 1F:
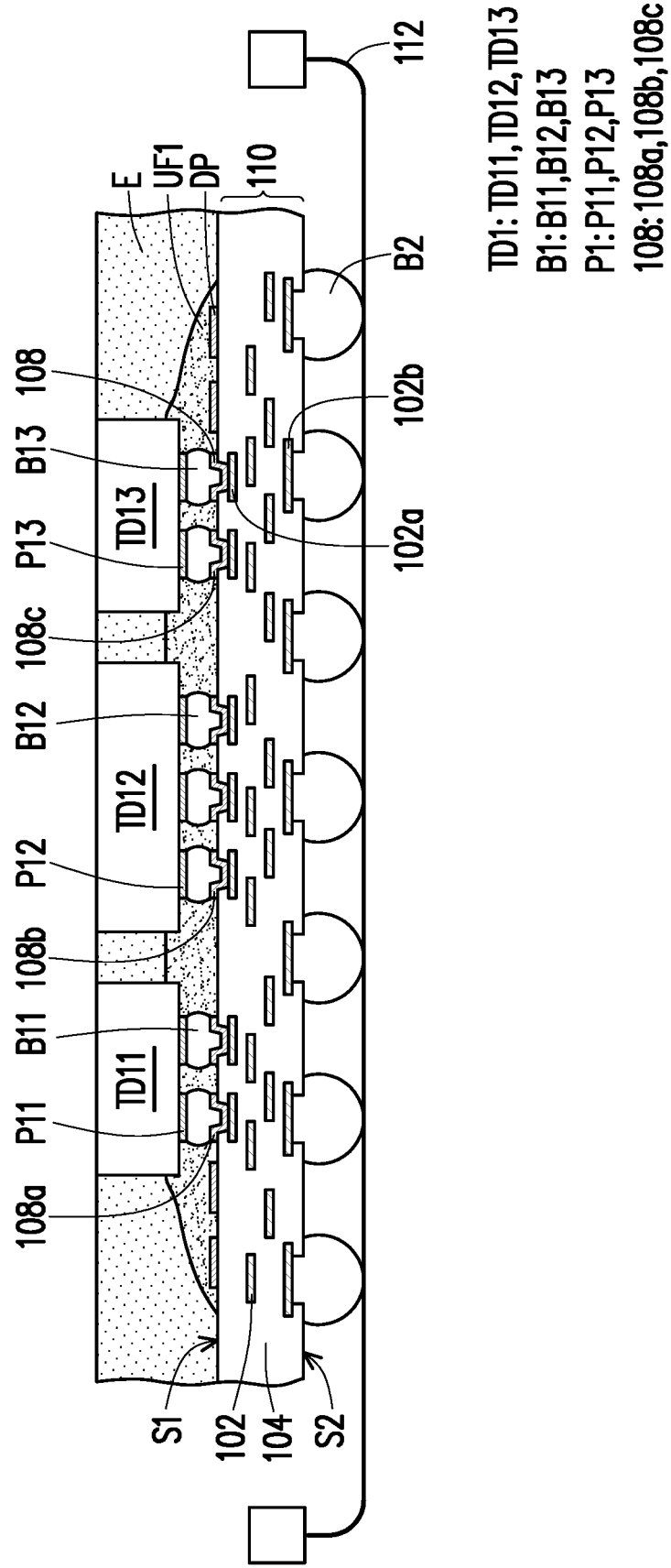

Referring to FIG. 1F, the encapsulation layer E is thinned to expose surfaces (e.g., backsides) of the integrated circuit structures TD11, TD12 and TD13. The thinning may be accomplished by a CMP, a grinding process, or the like. After the thinning, the surface of the encapsulation layer E is substantially level with the exposed surfaces the integrated circuit structures TD11, TD12 and TD13.

Figure 1G:
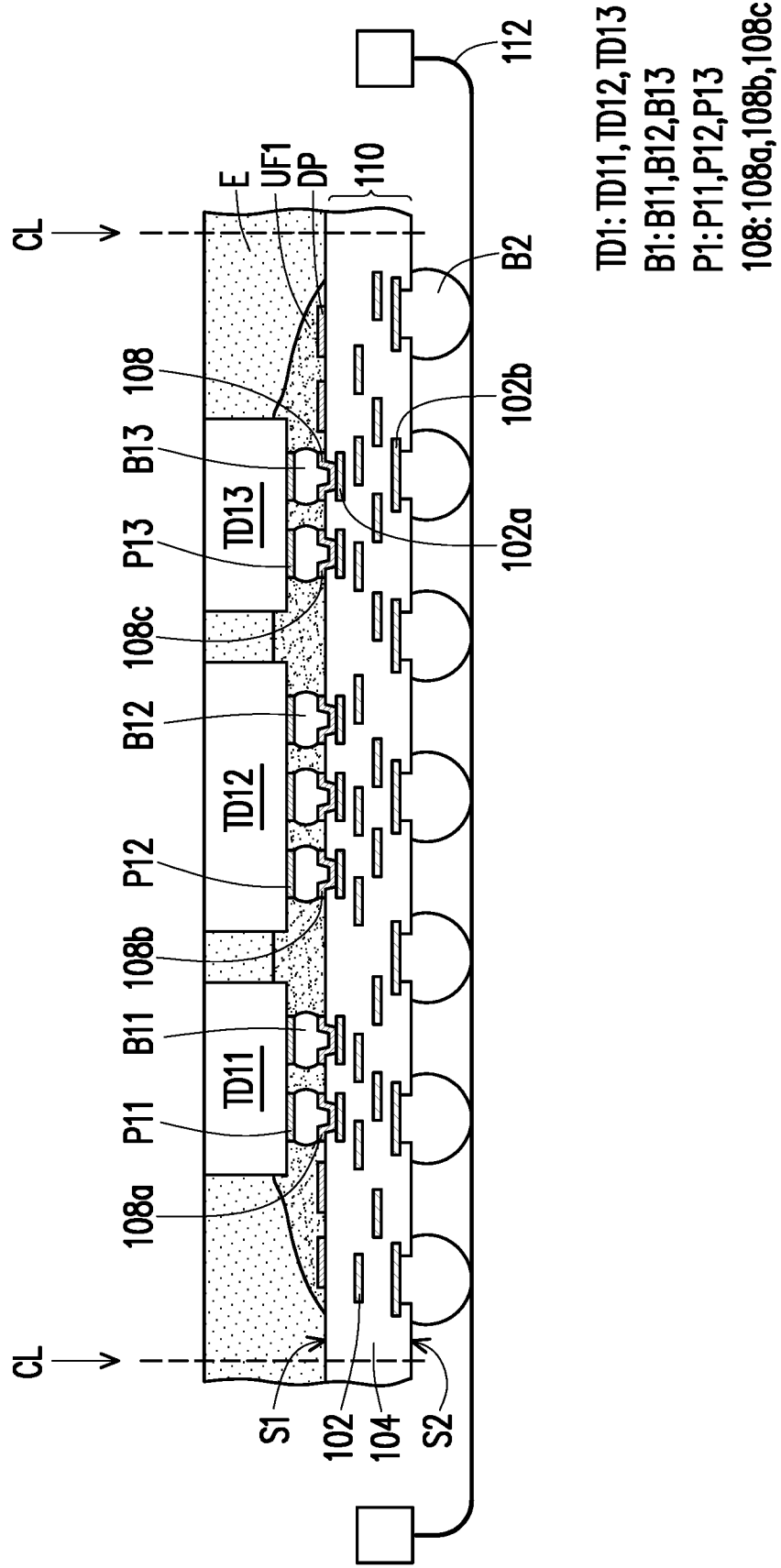
Figure 1H:
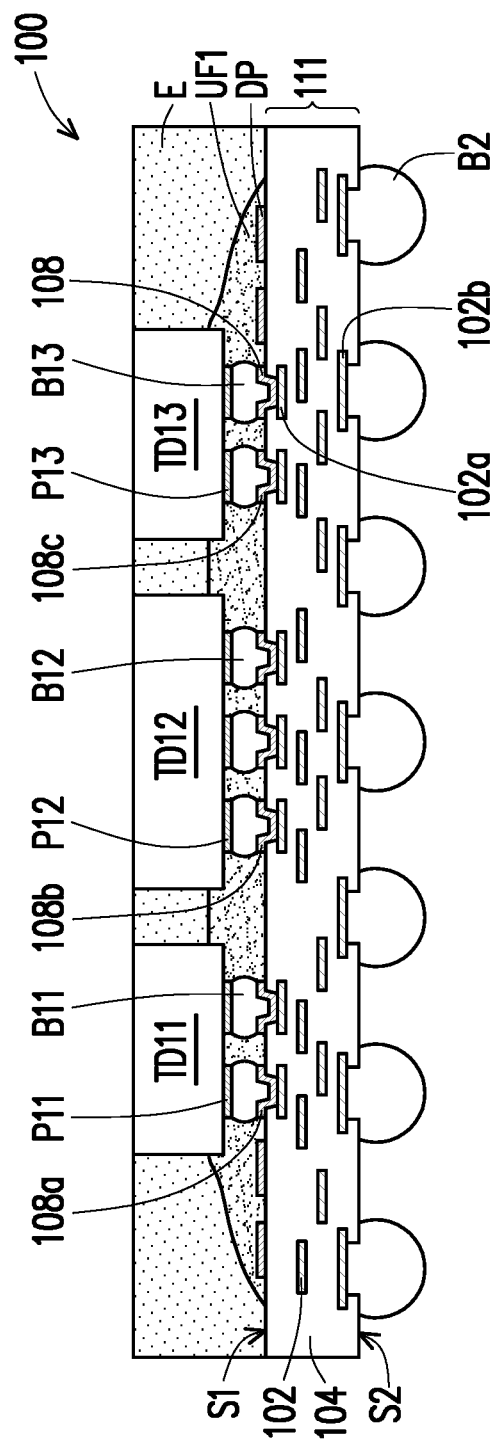
Figure 1I:
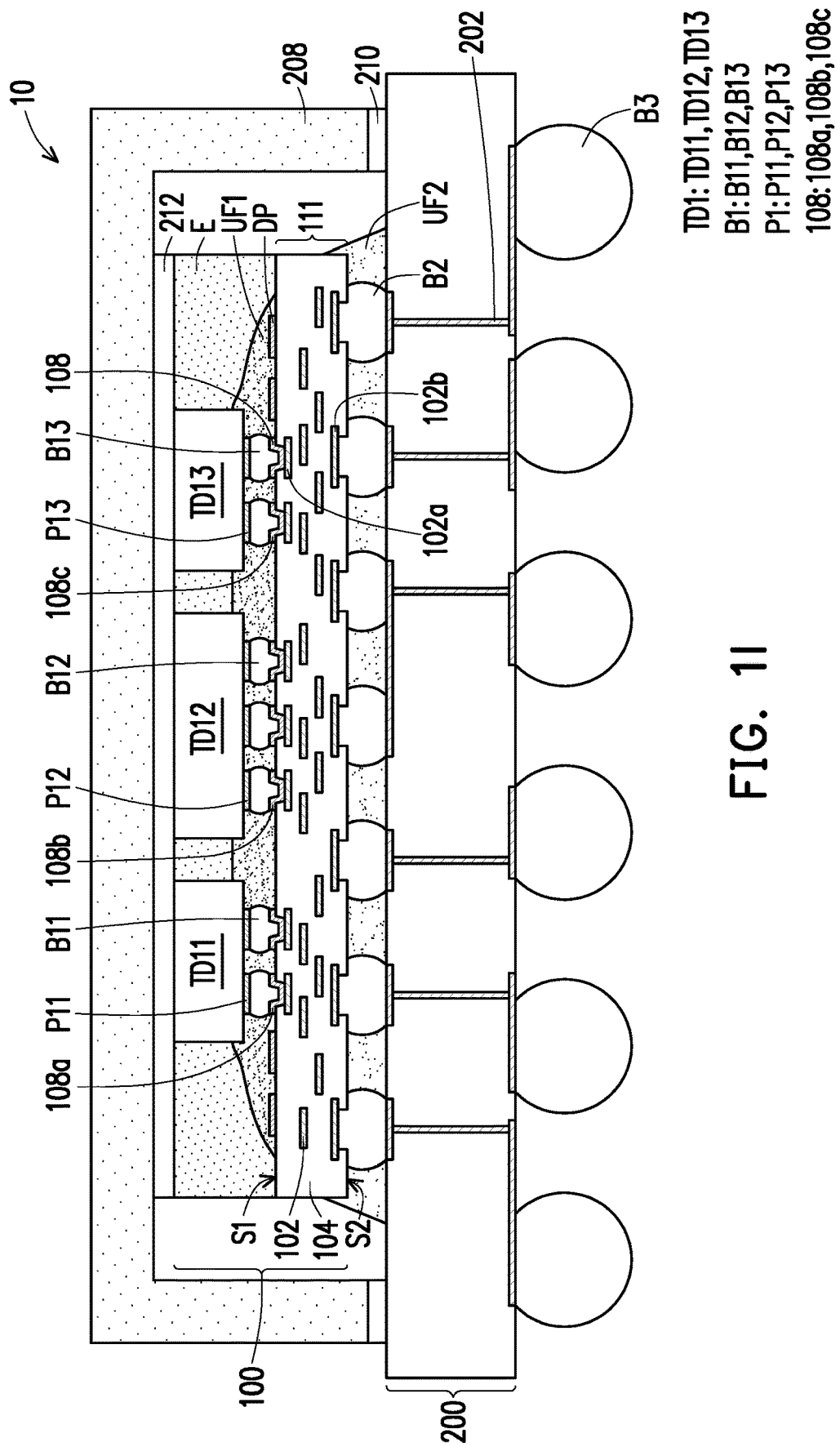

Referring to FIG. 1G and FIG. 1I, the interposer substrate 110 and encapsulation layer E are singulated by a singulation process, so as to separate a first device package 100 from an adjacent first device package 100. After the singulation process of FIG. 1G, the interposer substrate 110 is singulated into multiple separate interposers 111, and each of the first device packages 100 has an interposer 111, as shown in FIG. 1I. The singulation may be performed while the interposer substrate 110 is on the tape 112. Singulation is performed along scribe line regions CL between adjacent package regions. In some embodiments, the singulation process includes a sawing process, a laser process, or a combination thereof.

FIG. 1I shows a resulting first device package 100 after singulation. As a result of the singulation process, edges of the interposers 111 and the encapsulation layer E are coterminous. In other words, the outer sidewall of the interposer 111 is aligned with the outer sidewall of the encapsulation layer E.

Referring to FIG. 1I, a second integrated circuit package 200 is provided, and a first device package 100 is mounted on the second integrated circuit package 200. In some embodiments, the first integrated circuit package 100 is bonded to the second integrated circuit package 200 through the bumps B2.

In some embodiments, the second integrated circuit package 200 is a package substrate or a board substrate with wiring patterns therein. In some embodiments, the second integrated circuit package 200 includes a core layer and two build-up layers on opposite sides of the core layer. In some embodiments, the core layer includes prepreg (which contains epoxy, resin, and/or glass fiber), polyimide, photo image dielectric (PID), the like, or a combination thereof. In some embodiments, the build-up layers include prepreg (which contains epoxy, resin, and/or glass fiber), polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), the like, or a combination thereof. The material of the core layer may be different from the material of the build-up layers. In some embodiments, the second integrated circuit package 200 includes wiring patterns 202 that penetrate through the core layer and the build-up layers for providing electrical routing between different components. The wiring patterns 202 include lines, vias, pads and/or connectors. The second integrated circuit package 200 is referred to as a "board substrate" or "printed circuit board (PCB)" in some examples. In other embodiments, the core layer of second integrated circuit package 200 may be omitted as needed, and such board substrate 200 is referred to as a "coreless board substrate".

In other embodiments, the second integrated circuit package 200 includes a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the second integrated circuit package 200 may include a SOI substrate. The second integrated circuit package 200 may also include metallization layers over the semiconductor substrate. The metallization layers may be formed of alternating layers of dielectric (e.g. low-k dielectric material) and conductive material (e.g., copper) with vias interconnecting the layers of conductive material and may be formed through any suitable process (such as deposition, damascene, dual damascene, or the like).

In some embodiments, the second integrated circuit package 200 may include active and passive devices (not shown). A wide variety of devices such as transistors, capacitors, resistors, combinations of these, and the like may be used to generate the structural and functional requirements of the design for the second integrated circuit package 200. In some embodiments, passive devices (e.g., surface mount devices (SMDs), not illustrated) may be attached to the second integrated circuit package 200 before the first device package 100 is mounted to the second integrated circuit package 200. The passive devices may be bonded to the same surface of the second integrated circuit package 200 as the bumps B2. The passive devices may be mounted between the adjacent integrated circuit structures or outside of the integrated circuit structures. Such second integrated circuit package 200 is referred to as a "second device package" in some examples.

In other embodiments, the second integrated circuit package 200 is substantially free of active and passive devices. Such second integrated circuit package 200 is referred to as a "second package substrate" in some examples.

Thereafter, an underfill layer UF2 is formed to fill the space between the first device package 100 and the second integrated circuit package 200, and surrounds the bumps B2. In some embodiments, the underfill layer UF2 includes a molding compound such as epoxy, and is formed using dispensing, injecting, and/or spraying process.

In some embodiments, bumps B3 are formed below and electrically connected to the second integrated circuit package 200. Specifically, the bump B3 are electrically connected to the wiring patterns 202 of the second integrated circuit package 200. In some embodiments, the bumps B3 include solder bumps, and/or may include metal pillars, solder caps formed on metal pillars, and/or the like. The metal pillars include copper, aluminum, gold, nickel, silver, palladium, tin, the like, or a combination thereof. The bumps B3 are referred to as "ball grid array (BGA) balls" in some examples. The bumps B3 may be formed by a suitable process such as evaporation, electroplating, ball drop, or screen printing.

Still referring to FIG. 1I, a heat spreader 208 is attached to the second integrated circuit package 200, covering and surrounding the first device package 100. In some embodiments, the heat spreader 208 is attached to tops of the integrated circuit structures TD11, TD12 and TD13. In some embodiments, when the integrated circuit structures are die stacks, the heat spreader is attached to the topmost integrated circuit dies of the die stacks. The heat spreader 208 may be formed from a material with high thermal conductivity, such as steel, stainless steel, copper, the like, or combinations thereof. In some embodiments, the heat spreader 208 is coated with another metal, such as gold, nickel, or the like. In some embodiments, the heat spreader 208 is a single contiguous material. In some embodiments, the heat spreader 208 includes multiple pieces that may be the same or different materials.

The heat spreader 208 is adhered to the first device package 100 and second integrated circuit package 200. An adhesive 210 attaches the heat spreader 208 to the second integrated circuit package 200. The adhesive 210 may be epoxy, glue, or the like, and may be a thermally conductive material. A thermal interface material (TIM) 212 attaches the heat spreader 208 to the first device package 100. The TIM 212 thermally couples the first device package 100 and heat spreader 208. The TIM 212 may be a polymeric material, solder paste, indium solder paste, or the like, and may be dispensed on the first device package 100, such as on the integrated circuit structures TD11, TD12 and TD13 and the encapsulation layer E. A 3DIC package 10 of the disclosure is thus completed.

Figure 13:
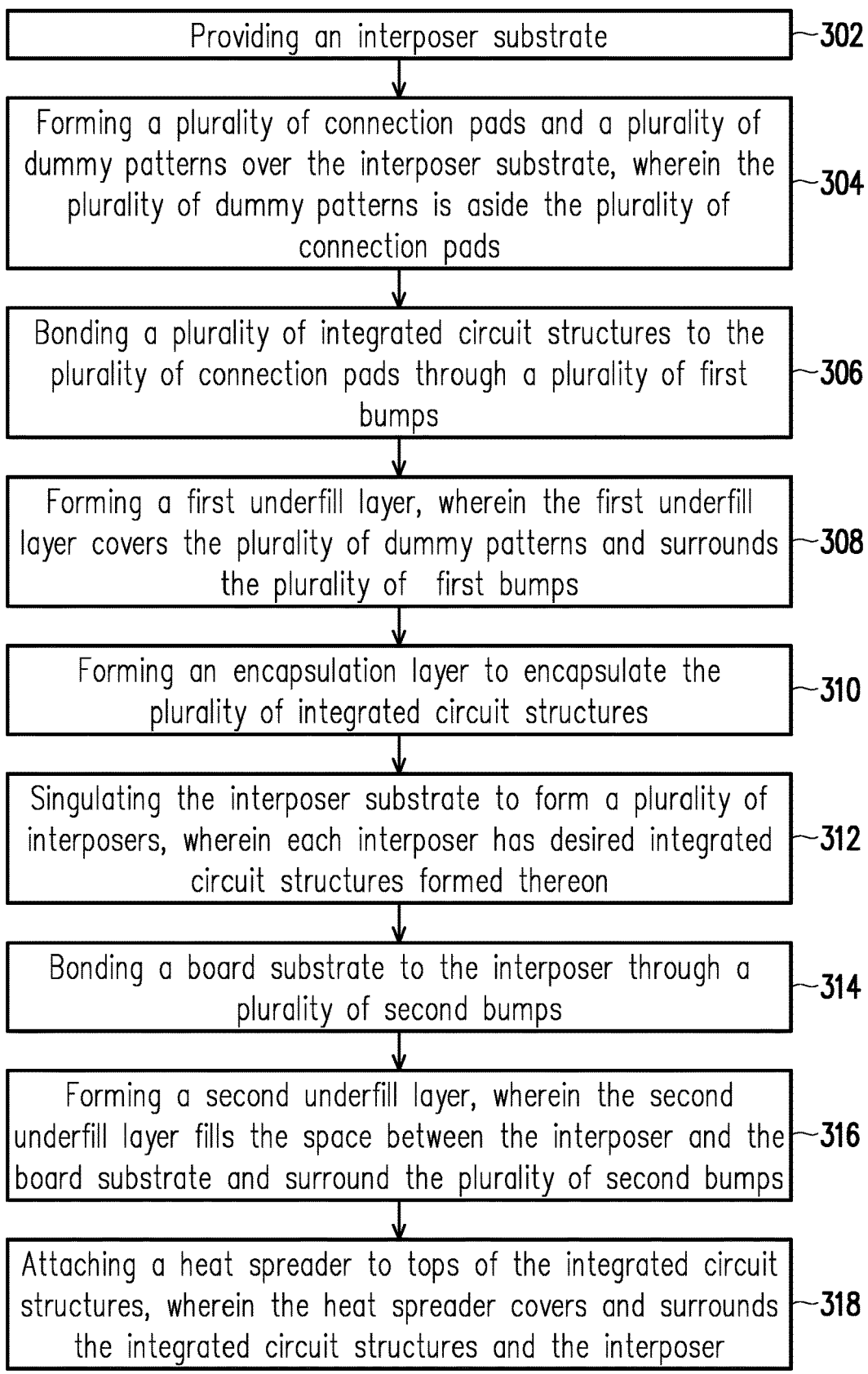
FIG. 13 illustrates a method of forming a 3DIC package in accordance with some embodiments.

FIG. 13 illustrates a method of forming a 3DIC package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 302, an interposer substrate is provided. FIG. 1A illustrates a cross-sectional view corresponding to some embodiments of act 302.

At act 304, a plurality of connection pads and a plurality of dummy patterns are formed over the interposer substrate, wherein the plurality of dummy patterns is aside the plurality of connection pads. FIG. 1B illustrates a cross-sectional view corresponding to some embodiments of act 304.

At act 306, a plurality of integrated circuit structures is bonded to the plurality of connection pads through a plurality of first bumps. FIG. 1C illustrates a cross-sectional view corresponding to some embodiments of act 306.

At act 308, a first underfill layer is formed to cover the plurality of dummy patterns and surround the plurality of first bumps. FIG. 1C illustrates a cross-sectional view corresponding to some embodiments of act 308.

At act 310, an encapsulation layer is formed to encapsulate the plurality of integrated circuit structures. FIG. 1D to FIG. 1F illustrate cross-sectional views corresponding to some embodiments of act 310.

At act 312, the interposer substrate is singulated to form a plurality of interposers, wherein each interposer has desired integrated circuit structures formed thereon. FIG. 1G to FIG. 1H illustrate cross-sectional views corresponding to some embodiments of act 312.

At act 314, a board substrate is bonded to the interposer through a plurality of second bumps. FIG. 1I illustrates a cross-sectional view corresponding to some embodiments of act 314.

At act 316, a second underfill layer is formed to fill the space between the interposer and the board substrate and surround the plurality of second bumps. FIG. 1I illustrates a cross-sectional view corresponding to some embodiments of act 316.

At act 318, a heat spreader is attached to tops of the integrated circuit structures, wherein the heat spreader covers and surrounds the integrated circuit structures and the interposer. FIG. 1I illustrates a cross-sectional view corresponding to some embodiments of act 318.

The above embodiments in which the dummy patterns and the connection pads are formed simultaneously in the same process step are provided for illustration purposes, and are not construed as limiting the present disclosure. In other embodiments, the dummy patterns and the connection pads can be formed separately in different process steps. Specifically, the dummy patterns can be formed before or after the step of forming the connection pads.

FIG. 14 to FIG. 19 are cross-sectional views of 3DIC packages in accordance with other embodiments.

Figure 14:
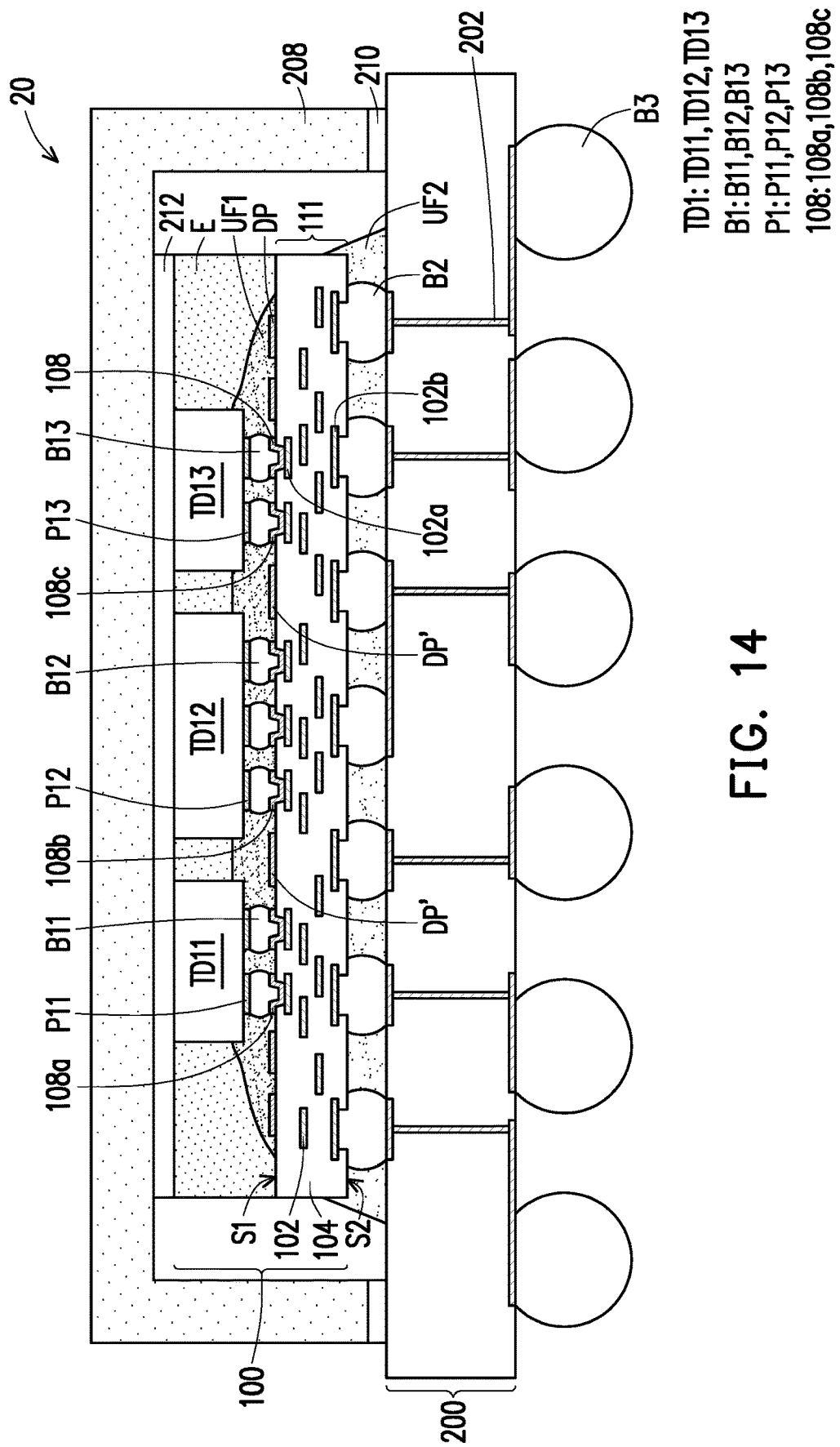
FIG. 14 to FIG. 19 are cross-sectional views of 3DIC packages in accordance with other embodiments.

The 3DIC package 20 of FIG. 14 is similar to the 3DIC package 10 of FIG. 1I, and the difference between them lies in that, the 3DIC package 20 further includes dummy patterns DP' in addition to the dummy patterns DP. The dummy patterns DP' are optionally disposed between two adjacent integrated circuit structures (e.g., between TD11 and TD12 or between TD12 and TD13), so as to further increase the capillary attraction during the underfill dispensing step. In some embodiments, the dummy patterns DP' extend below at least one of the two adjacent integrated circuit structures. In other embodiments, the dummy patterns DP' are not overlapped with the two adjacent integrated circuit structures.

Figure 15:
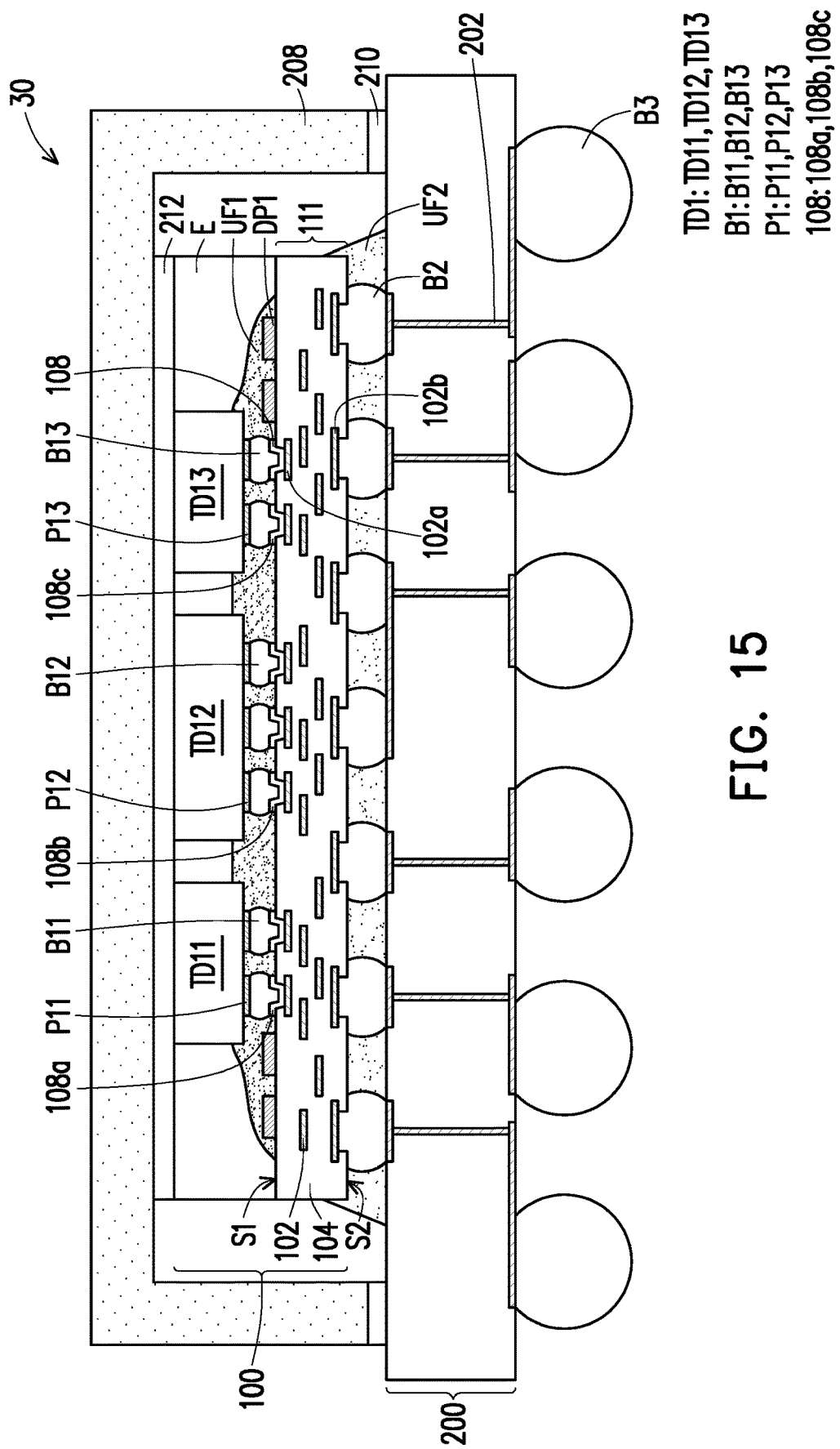

The 3DIC package 30 of FIG. 15 is similar to the 3DIC package 10 of FIG. 1I, and the difference between them lies in that, the dummy patterns DP1 of the 3DIC package 30 are thicker than the dummy patterns DP of the 3DIC package 10. In the 3DIC package 10 of FIG. 1I, the connection pads 108 and the dummy patterns DP are made by the same material, provided with substantially equal thickness, and formed simultaneously in the same process step. In the 3DIC package 30 of FIG. 15, the connection pads 108 and the dummy patterns DP1 are made by the same material, provided with different thickness, and formed in different process steps. Thicker dummy patterns DP1 further prevent the underfill from creeping onto the chip backside during the underfill dispensing step. In some embodiments, such thicker dummy patterns may be disposed between two adjacent integrated circuit structures upon the process requirements.

Figure 16:
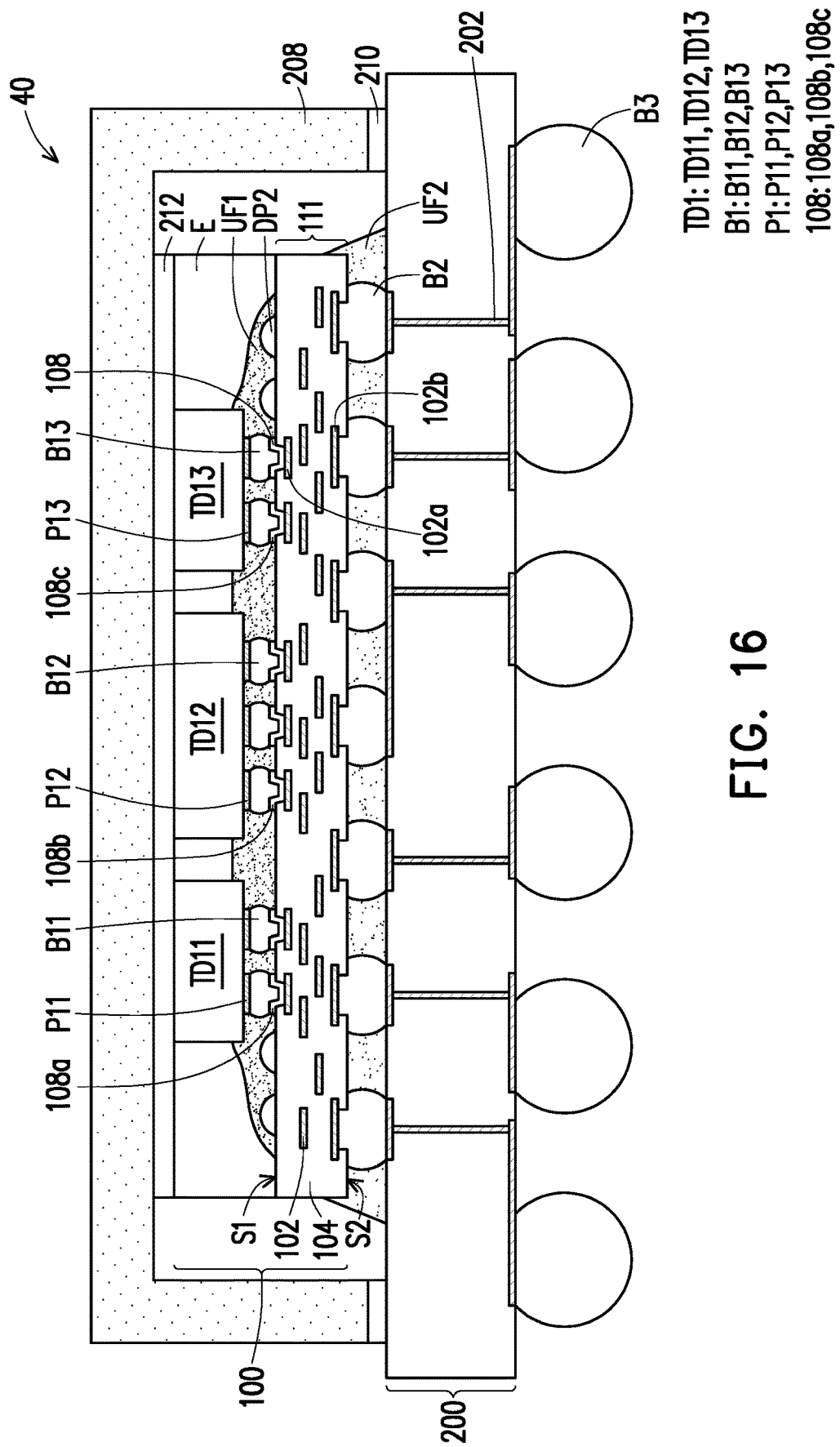

The 3DIC package 40 of FIG. 16 is similar to the 3DIC package 10 of FIG. 1I, and the difference between them lies in that, the dummy patterns DP2 of the 3DIC package 40 include a polymer, while the dummy patterns DP of the 3DIC package 10 include a metal. In some embodiments, the dummy patterns DP2 are polymer domes including a molding compound such as epoxy, a photo-sensitive material such as polybenzoxazole (PBO), polyimide (PI) or benzocyclobutene (BCB), a combination thereof or the like. The dummy patterns DP2 are formed using dispensing, injecting, and/or spraying techniques. In some embodiments, such polymer dummy patterns may be disposed between two adjacent integrated circuit structures upon the process requirements. The shapes, sizes, variations, configurations and distributions of the dummy patterns DP2 are similar to those described for dummy patterns DP, and the details are not iterated herein.

The above embodiments in which each dummy pattern is a single-material dummy pattern (e.g., metal dummy pattern or polymer dummy pattern) is provided for illustrations purposes, and are not construed as limiting the present disclosure. In some embodiments, at least one of the dummy patterns can be a composite dummy pattern including a metal and a polymer.

Figure 17:
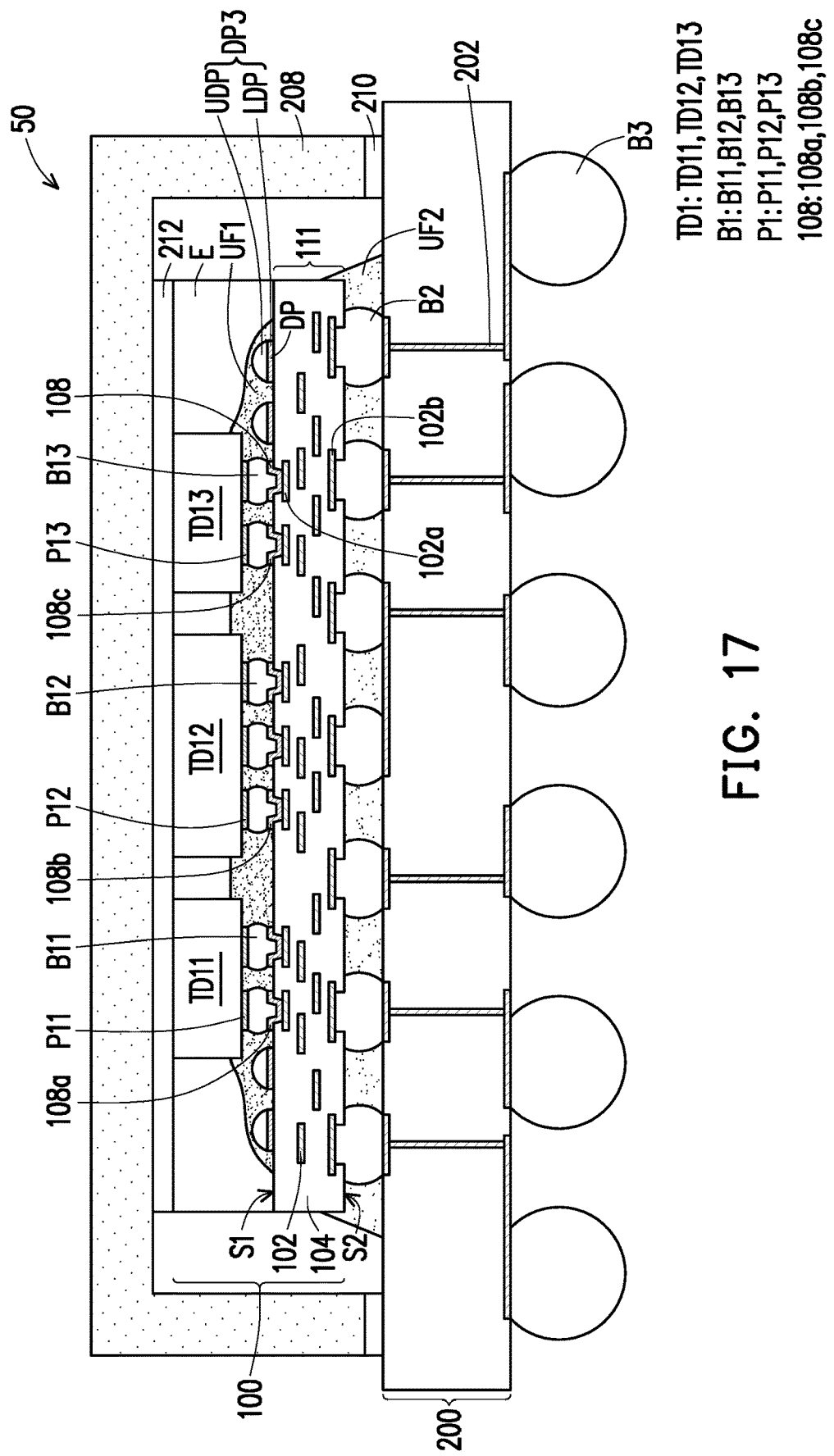

As shown in FIG. 17, each dummy pattern DP3 of the 3DIC structure 50 includes a lower dummy pattern LDP and an upper dummy pattern UDP over the lower dummy pattern LDP. In some embodiments, the lower dummy patterns LDP include a metal and are formed simultaneously during the formation of the connection pads 108, and the upper dummy patterns UDP include a polymer and are formed after forming the connection pads 108. In some embodiments, such composite dummy patterns may be disposed between two adjacent integrated circuit structures upon the process requirements. The shapes, sizes, variations, configurations and distributions of the dummy patterns DP3 are similar to those described for dummy patterns DP, and the details are not iterated herein.

Figure 18:
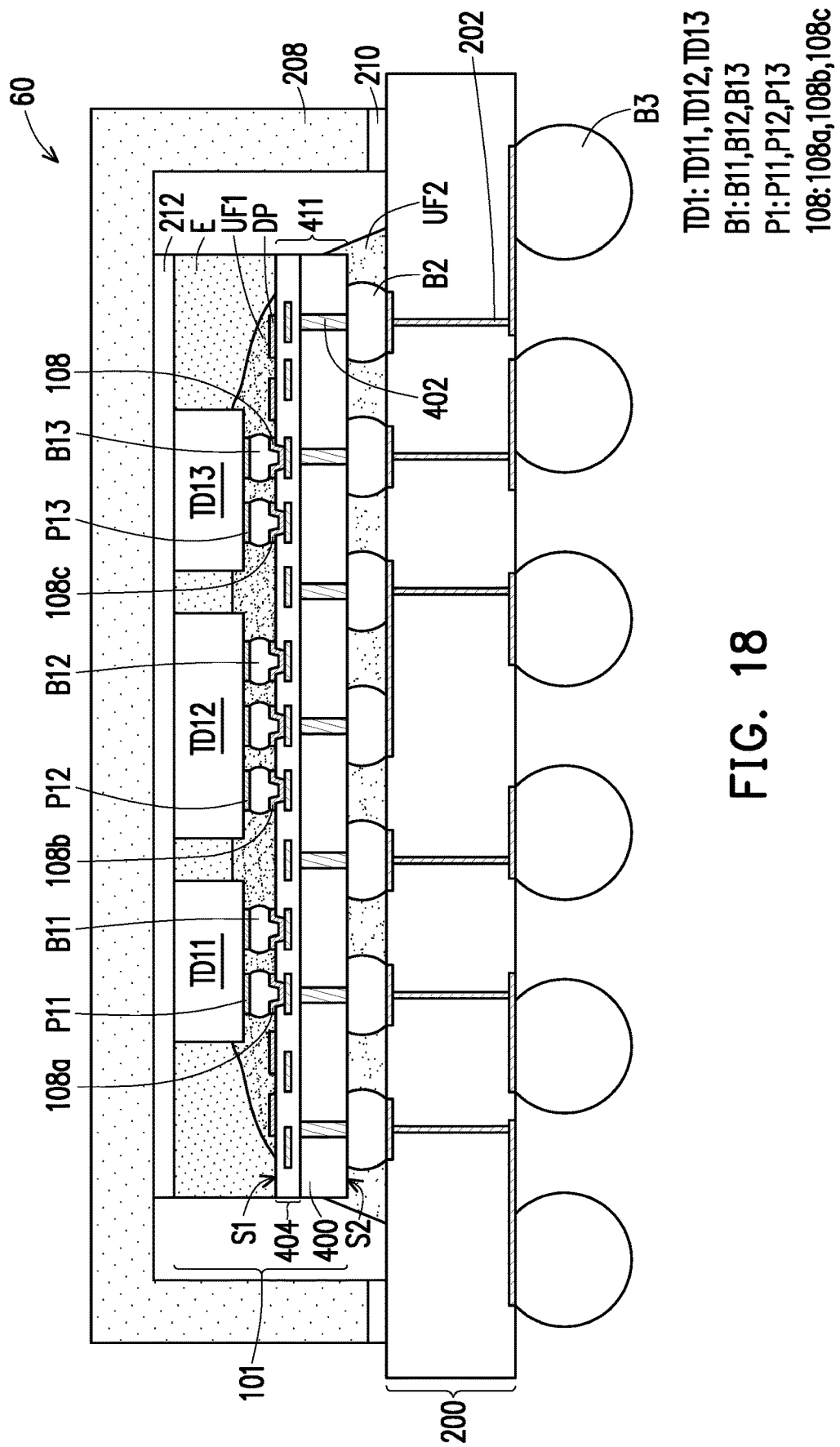

The 3DIC package 60 of FIG. 18 is similar to the 3DIC package 10 of FIG. 1I, and the difference between them lies in that, the interposer 111 of the 3DIC package 60 is an organic interposer, while the interposer 411 of the 3DIC package 60 is a silicon interposer.

In some embodiments, the interposer 411 includes a substrate 400, through substrate vias 402 and a conductive structure 404. The substrate 400 may include elementary semiconductor such as silicon. The substrate 400 may be doped as needed. The through substrate vias 402 (also called "through silicon vias" in some examples) extend from a front side of the substrate 400 toward a back side of the substrate 400.

In some embodiments, the conductive structure 404 is optionally disposed over the front side of the substrate 400. In some embodiments, the conductive structure 404 includes dielectric layers and conductive features embedded by the dielectric layers. The conductive features include metal lines, metal vias, metal pads and/or metal connectors. In some embodiments, each conductive feature includes Cu, Al, Ti, Ta, W, Ru, Co, Ni, the like, or a combination thereof. In some embodiments, a seed layer and/or a barrier layer may be disposed between each conductive feature and the adjacent polymer layer. The seed layer may include Ti/Cu. The barrier layer may include Ta, TaN, Ti, TiN, CoW or a combination thereof. In some embodiments, each dielectric layer includes silicon oxide, silicon nitride, silicon oxynitirde, SiOC, the like, or a combination thereof. An etching stop layer may be interposed between two adjacent dielectric layers. The dielectric layers of the first conductive structure 404 may be replaced by polymer layers or insulating layers as needed. In some embodiments, each polymer layer includes a photo-sensitive material such as polybenzoxazole (PBO), polyimide (PI), benzocyclobutene (BCB), the like, or a combination thereof.

In some embodiments, the interposer 411 is an active interposer that contains at least one functional device or integrated circuit device included in the conductive structure 404. Such active interposer is referred to as a "device-containing silicon interposer" in some examples. In some embodiments, the functional device includes an active device, a passive device, or a combination thereof. The functional device includes, for example but not limited to, transistors, capacitors, resistors, diodes, photodiodes, fuse devices and/or other similar components.

In other embodiments, the interposer 411 is a passive interposer, which is used to convey a lack of a functional device or integrated circuit device. Such passive interposer is referred to as a "device-free silicon interposer" in some examples.

Instead of the dummy patterns DP, dummy patterns DP1/DP2/DP3 may be applied to the 3DIC package 60 of FIG. 18 upon the process requirements. Besides, some of dummy patterns may be disposed between two adjacent integrated circuit structures upon the process requirements.

Figure 19:
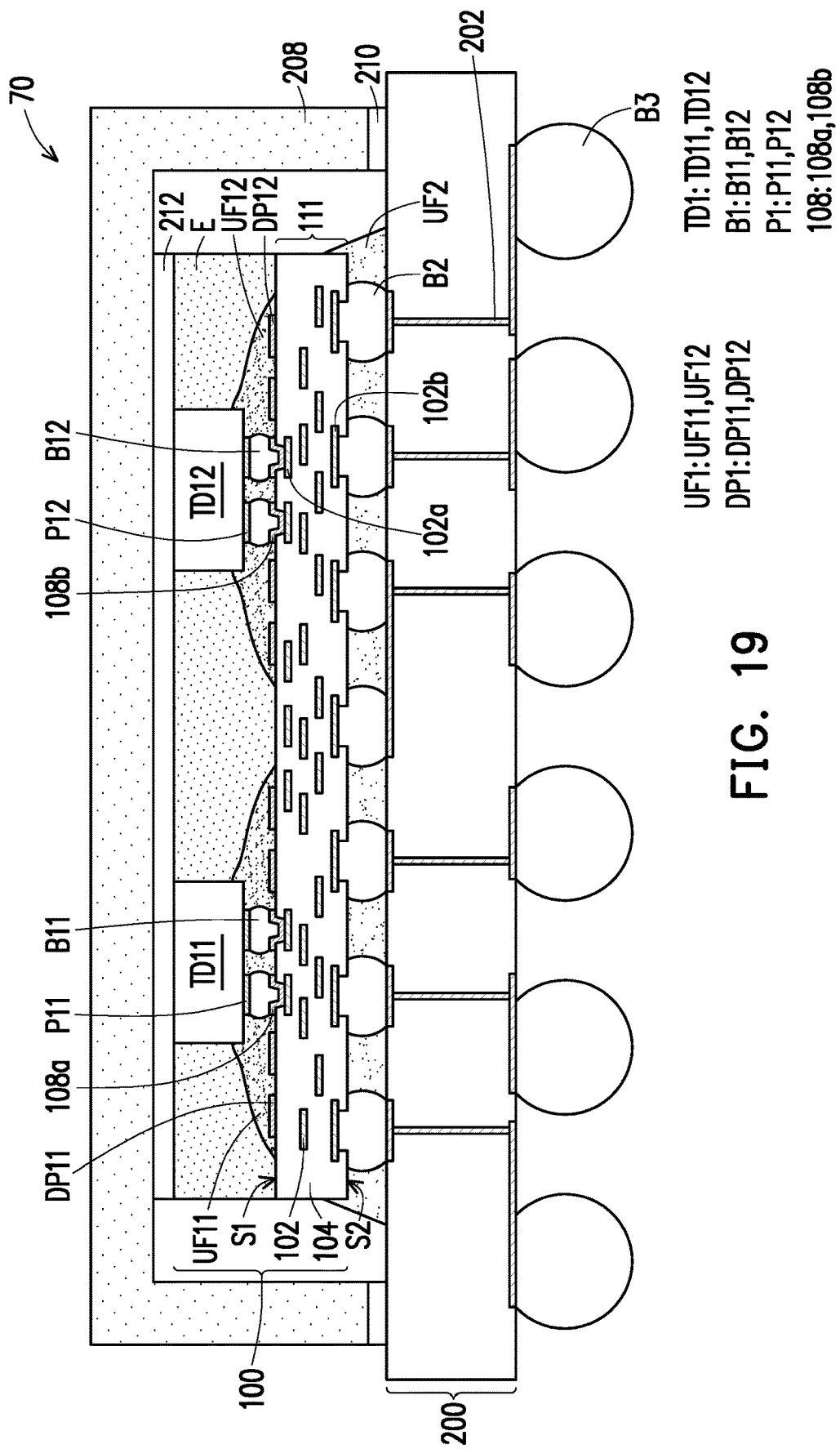

The 3DIC package 70 of FIG. 19 is similar to the 3DIC package 10 of FIG. 1I, and the difference between them lies in that, the integrated circuit structures of the 3DIC package 70 are spaced more widely than those of the 3DIC package 10. In such case, the dummy patterns DP11 may be disposed surrounding the integrated circuit structure TD11, and the dummy patterns DP12 may be disposed surrounding the integrated circuit structure TD12. The formed underfill layer UF11 covers the dummy patterns DP11, and the formed underfill layer UF12 covers the dummy patterns DP12. In some embodiments, the underfill layer UF11 may be separated from the underfill layer UF12. In other embodiments, the underfill layer UF11 may be connected to the underfill layer UF12. In some embodiments, a dummy dam (e.g., metal dam or polymer dam) may be disposed on the interposer 111 between the underfill layer UF11 and the underfill layer UF12, so that the underfill layer UF11 is separated from the underfill layer UF12 by the dummy dam.

Instead of the dummy patterns DP, dummy patterns DP1/DP2/DP3 may be applied to the 3DIC package 70 of FIG. 18 upon the process requirements. Besides, some of dummy patterns may be disposed between two adjacent integrated circuit structures upon the process requirements. Instead of the organic interposer 111, a silicon interposer 411 may be applied to the 3DIC package 70 of FIG. 19 upon the process requirements.

The structures of 3DIC packages of the disclosure are illustrated below with reference to FIG. 1I to FIG. 19.

In some embodiments, a 3DIC structure 10/20/30/40/50/60/70 includes an interposer 111/411, a plurality of connection pads 108, a plurality of dummy patterns DP/DP1/DP2/DP3, a plurality of integrated circuit structures TD1 and an underfill layer UF1. The connection pads 108 are disposed on and electrically connected to a first side S1 of the interposer 111/411. The dummy patterns DP/DP1/DP2/DP3 are disposed on the first side S1 of the interposer 111/411 and around the plurality of connection pads 108. The integrated circuit structures TD1 are electrically connected to the connection pads 108 through a plurality of first bumps B1. The underfill layer UF1 surrounds the first bumps B1 and covers the dummy patterns DP/DP1/DP2/DP3.

In some embodiments, as shown in top views of FIGS. 2-12, an integrated circuit structure is protruded out from an adjacent integrated circuit structure of the plurality of integrated circuit structures.

In some embodiments, as shown in top views of FIGS. 2-12, at least one of the dummy patterns DP/DP1/DP2/DP3 is overlapped with at least one of the plurality of integrated circuit structures TD11/TD12/TD13. In some embodiments, as shown in top views of FIGS. 2-12, at least one of the dummy patterns DP/DP1/DP2/DP3 is separated from (e.g., not overlapped with) the integrated circuit structures TD11/TD12/TD13. However, the disclosure is not limited thereto. In some embodiments, from a top view, all of the dummy patterns are not overlapped with the overlying integrated circuit structures.

In some embodiments, the dummy patterns DP/DP1/DP2/DP3 are disposed along sidewalls of one integrated circuit structure not adjacent to other integrated circuit structures of the plurality of integrated circuit structures. In some embodiments, some of the dummy patterns DP/DP1/DP2/DP3 extend under (e.g., disposed below) outermost integrated circuit structures of the plurality of integrated circuit structures. In some embodiments, the height of the dummy patterns DP/DP1/DP2/DP3 is less than the height of the first bumps B1. Specifically, the tops of the dummy patterns of the disclosure are separated from (e.g., not in physical contact with) the bottoms of the overlying integrated circuit structures.

In some embodiments, the dummy patterns DP/DP1/DP3 include a metal. In some embodiments, the dummy patterns DP2/DP3 include a polymer. In some embodiments, the dummy patterns DP3 include a metal and a polymer. In some embodiments, the material of the dummy patterns is hydrophobic, and the contact angle of the dummy patterns is greater than the contact angle of silicon. In some embodiments, the dummy patterns have a water contact angle of 20° or more, such as from 20° to 120°. For example, the dummy patterns have a water contact angle of, for example but not limited to, about 20°, 30°, 40°, 50°, 60°, 70°, 80°, 90°, 100°, 110° or 120°, including any range between any two of the preceding values and any range more than any one of the preceding values. The dummy patterns can be referred to "hydrophobic dummy patterns" in some examples. The dummy patterns have such water contact angle so as to effectively prevent the underfill material from creeping onto the exposed surfaces of the chips.

In some embodiments, the dummy patterns DP/DP1 and the connection pads 108 are made by the same material. In some embodiments, the dummy patterns DP2/DP3 and the connection pads 108 are made by different materials.

In some embodiments, the dummy patterns DP/DP1/DP2/DP3 are electrically insulated from the interposer 111/411. In some embodiments, the dummy patterns DP/DP1/DP2/DP3 are in a form of dots, strips, grids or combinations thereof.

In some embodiments, some of the dummy patterns (e.g., dummy patterns DP') are disposed between two adjacent integrated circuit structures of the plurality of integrated circuit structures.

In some embodiments, the interposer 111 is an organic interposer. The organic interposer is beneficial to reduce the total process cost of the package structure since the organic interposer is a low-cost interposer. In some embodiments, the critical dimension (e.g., line width or space width) of the organic interposer is closer to the critical dimension of at least one of the semiconductor chips.

In some embodiments, the interposer 411 is a silicon interposer. The silicon interposer is beneficial to integrate one or more passive devices (e.g., capacitors) into the package structure. In some embodiments, the one or more passive devices are embedded and buried in the silicon interposer upon the design requirements.

In some embodiments, the integrated circuit structures TD1 have the same function, and such 3DIC package is called a homogenous package. In some embodiments, the integrated circuit structures TD1 have different functions, and such 3DIC package is called a heterogeneous package.

In some embodiments, a 3DIC structure 10/20/30/40/50/70 includes a board substrate (e.g., second integrated circuit package 200), an organic interposer 111, a plurality of integrated circuit structures TD1 and a plurality of underfill dragging structures (e.g., dummy patterns DP/DP1/DP2/DP3). The organic interposer 111 is disposed over and electrically connected to the board substrate. The integrated circuit structures TD1 are disposed over and electrically connected to the organic interposer 111. The underfill dragging structures are disposed over the organic interposer 111 and located along an outer periphery or boundary of the plurality of the integrated circuit structures TD1.

In some embodiments, locations of some of the plurality of underfill dragging structures are overlapped with (e.g., partially overlapped with) locations of outermost integrated circuit structures of the plurality of integrated circuit structures. In some embodiments, locations of some of the plurality of underfill dragging structures are not overlapped with (e.g., separated from) locations of outermost integrated circuit structures of the plurality of integrated circuit structures.

In accordance with some embodiments of the present disclosure, a 3DIC structure 10/60 includes an interposer 111/411, a plurality of connection pads 108, a plurality of dummy patterns DP and a plurality of integrated circuit structures TD1. The connection pads 108 are disposed on and electrically connected to a first side S1 of the interposer. The dummy patterns DP are disposed on the first side of the interposer 111/411 and around the plurality of connection pads 108. The integrated circuit structures TD1 are electrically connected to the plurality of connection pads 108 through a plurality of first bumps B1. The connection pads 108 and the dummy patterns DP are formed by a same photolithography reticle. Accordingly, the connection pads 108 and the dummy patterns DP are made by a same material.

In some embodiments, a dimension of one dummy pattern is different from a dimension of another dummy pattern adjacent to the one dummy pattern. In some embodiments, a dimension of the dummy patterns is different from a dimension of the connection pads. The dimension includes a height, a width, a length, a size, a top-view area or a combination thereof.

In view of the above, in the 3DIC package of the present disclosure, multiple dummy patterns are provided over an interposer and aside the UBM pads. The dummy patterns are configured to prevent an underfill material from creeping onto the exposed sides of the chips during the underfill dispensing step. Besides, the dummy patterns of the disclosure are beneficial to reduce the underfill creeping height (that is, the underfill height is less than the height of the integrated circuit structure), so as to provide anchoring force for production, resolve the chip crack issue and accordingly improve the reliability of the package and enhance the underfill dispensing process. Moreover, the dummy patterns of the disclosure enhance capillary attraction during the dispensing step, and therefore shorten the underfill dispensing time and improve the wafer per hour (WPH) in production.

In accordance with some embodiments of the present disclosure, a 3DIC structure includes an interposer, a plurality of connection pads, a plurality of dummy patterns, a plurality of integrated circuit structures and an underfill layer. The connection pads are disposed on and electrically connected to a first side of the interposer. The dummy patterns are disposed on the first side of the interposer and around the plurality of connection pads. The integrated circuit structures are electrically connected to the connection pads through a plurality of first bumps. The underfill layer surrounds the first bumps and covers the dummy patterns.

In accordance with some embodiments of the present disclosure, a 3DIC structure includes a board substrate, an organic interposer, a plurality of integrated circuit structures and a plurality of underfill dragging structures. The organic interposer is disposed over and electrically connected to the board substrate. The integrated circuit structures are disposed over and electrically connected to the organic interposer. The underfill dragging structures are disposed over the organic interposer and located along an outer periphery of the plurality of the integrated circuit structures.

In accordance with some embodiments of the present disclosure, a 3DIC structure includes an interposer, a plurality of connection pads, a plurality of dummy patterns and a plurality of integrated circuit structures. The connection pads are disposed on and electrically connected to a first side of the interposer. The dummy patterns are disposed on the first side of the interposer and around the plurality of connection pads. The integrated circuit structures are electrically connected to the plurality of connection pads through a plurality of first bumps. The connection pads and the dummy patterns are made by a same material.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional integrated circuit (3DIC) package, comprising:
   an interposer;
   first connection pads, disposed on and electrically connected to a first side of the interposer;
   second connection pads, disposed on and electrically connected to the first side of the interposed, wherein the second connection pads surround the first connection pads;
   dummy patterns, disposed on the first side of the interposer and around the second connection pads;
   a first integrated circuit structure, electrically connected to the first connection pads throung first bumps;
   second integrated circuit structures, surrounding the first integrated circuit structure, and electrically connected to the second connection pads through second bumps, wherein each side of the first integrated circuit structure faces two of the second integrated circuit structures; and
   an underfill layer, surrounding the first and second bumps and covering the dummy patterns,
   wherein from a top view, two of the second integrated circuit structures around a corner of the first integrated circuit structure have different sizes, sides of the two of the second integrated circuit structures facing toward a same periphery of the interposer are misaligned with each other and partially overlapped with some of the dummy patterns, and
   wherein a cross-sectional shape of the first and second connection pads is different from a cross-sectional shape of the dummy patterns.

2. The 3DIC package of claim 1, wherein from the top view, the dummy patterns are not overlapped with the first integrated circuit structures.

3. The 3DIC package of claim 1, wherein from the top view, at least one of the dummy patterns is separated from the second integrated circuit structures.

4. The 3DIC package of claim 1, wherein the dummy patterns and the first and second connection pads are made by a same material.

5. The 3DIC package of claim 1, wherein the dummy patterns have a water contact angle of about 20° to 120°.

6. The 3DIC package of claim 1, wherein the dummy patterns are electrically insulated from the interposer.

7. The 3DIC package of claim 1, wherein from the top view, the dummy patterns are not overlapped with inner sidewalls of the second integrated circuit structures facing the first integrated circuit structure.

8. The 3DIC package of claim 1, wherein at least one or the dummy patterns is overlapped with two adjacent second integrated circuit structures.

9. The 3DIC package of claim 1, wherein a side of at least one of the second integrated circuit structures is parallel to but not flush with a side of the first integrated circuit structure.

10. The 3DIC package of claim 1, further comprising:
an encapsulation layer, covering the underfill layer and filling in gaps between the first and second integrated circuit structures; and
a heat spreader, disposed over the first and second integrated circuit structures and adhered to a board substrate below the interposer, wherein the heat spreader is separated from the encapsulation layer and the underfill layer.

11. A three-dimensional integrated circuit (3DIC) package, comprising:
a board substrate;
an organic interposer, disposed over and electrically connected to the board substrate;
a first integrated circuit structure, electrically connected to the organic interposed;
second integrated circuit structures, surrounding the first integrated circuit structure and electrically connected to the organic interposed, wherein each side of the first integrated circuit structure faces two of the second integrated circuit structures, and outmost sidewalls of the second integrated circuit structures at a first side of first integrated circuit structure are protruded from outmost sidewalls of the second integrated circuit structures at a second side of first integrated circuit structure adjacent to the first side; and
a plurality of underfill dragging structures, disposed over the organic interposer and located along an outer periphery of the second the integrated circuit structures,
wherein from a top view, at least one of the underfill dragging structures is overlapped with two outer sidewalls of two adjacent second integrated circuit structures facing toward a periphery of the organic interposed,
wherein from the top view, at least one of the underfill dragging structures is partially overlapped with a single side of one of the seocnd intergrated circuit structures.

12. The 3DIC package of claim 11, wherein two of the second integrated circuit structures around a corner of the first integrated circuit structure have different sizes.

13. The 3DIC package of claim 11, wherein locations of the plurality of underfill dragging structures are not overlapped with a location of the first integrated circuit structure.

14. The 3DIC package of claim 11, wherein the underfill dragging structures are electrically insulated from the inorganic interposer.

15. The 3DIC package of claim 11, wherein a contact angle of the underfill dragging structures is greater than a contact angle of silicon.

16. The 3DIC package of claim 11, wherein the plurality of underfill dragging structures comprises a metal.

17. The 3DIC package of claim 11, wherein the plurality of underfill dragging structures is in a form of dots.

18. A three-dimensional integrated circuit (3DIC) package, comprising:
an interposer;
a plurality of connection pads, disposed on and electrically connected to a first side of the interposer;
a plurality of dummy patterns, disposed on the first side of the interposer and around the plurality of connection pads;
a plurality of second dummy patterns, disposed on the first side of the interposer and around the plurality of first dummy patterns;
a first integrated circuit structure, electrically connected to some of the connection pads; and
second integrated circuit structures, surrounding the first integrated circuit structure, and electrically connected to some of the connection pads, wherein each side of the first integrated circuit structure faces two of the second integrated circuit structures,
wherein from a top view, two of the second integrated circuit structures around a corner of the first integrated circuit structure have different sizes, sides of the two of the second integrated circuit structures facing toward a same periphery of the interposer are misaligned with each other and partially overlapped with some of the dummy patterns,
wherein a cross-sectional shape of the connection pads is different from a cross-sectional shape of the first and second dummy patterns, and
wherein a top-view shape of the first dummy patterns is the same as top-view shape of the second patterns.

19. The 3DIC package of claim 18, further comprising:
a board substrate disposed below the interposer; and
a heat spreader adhered to the board substrate.

20. The 3DIC package of claim 18, wherein from the top view, at least one of the first dummy patterns is partially overlapped with a single side of one of the second integrated circuit structures.

* * * * *